(12) United States Patent
Ji et al.

(10) Patent No.: US 12,089,438 B2
(45) Date of Patent: Sep. 10, 2024

(54) DISPLAY APPARATUS

(71) Applicant: Samsung Display Co., Ltd., Yongin-Si (KR)

(72) Inventors: Miran Ji, Yongin-si (KR); Hyunduck Cho, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/939,366

(22) Filed: Sep. 7, 2022

(65) Prior Publication Data

US 2023/0209883 A1 Jun. 29, 2023

(30) Foreign Application Priority Data

Dec. 29, 2021 (KR) .......................... 10-2021-0191798

(51) Int. Cl.
| | |
|---|---|
| *H10K 50/86* | (2023.01) |
| *G06F 3/041* | (2006.01) |
| *G06F 3/044* | (2006.01) |
| *G09G 3/3233* | (2016.01) |
| *H10K 59/122* | (2023.01) |

(Continued)

(52) U.S. Cl.
CPC ......... *H10K 50/865* (2023.02); *G06F 3/0412* (2013.01); *G09G 3/3233* (2013.01); *H10K 59/122* (2023.02); *H10K 59/38* (2023.02); *H10K 59/40* (2023.02); *G06F 3/0443* (2019.05); *G06F 3/0446* (2019.05); *G06F 2203/04112* (2013.01);
(Continued)

(58) Field of Classification Search
CPC .. H10K 59/126; H10K 59/122; H10K 59/352; H10K 59/38; H10K 59/40; H10K 50/86; H10K 50/865; G09G 3/3233; G09G 2300/0842; G09G 2320/068; G09G 2358/00; G06F 3/0412; G06F 3/0443; G06F 3/0446; G06F 2203/04112
USPC ................................................... 345/174, 76
See application file for complete search history.

(56) References Cited

U.S. PATENT DOCUMENTS

| | | | |
|---|---|---|---|
| 9,420,432 B2 | 8/2016 | Matthews, III et al. | |
| 9,978,816 B2 | 5/2018 | Kim et al. | |

(Continued)

FOREIGN PATENT DOCUMENTS

| | | |
|---|---|---|
| KR | 10-2016-0127274 A | 11/2016 |
| KR | 10-2018-0074985 A | 7/2018 |

(Continued)

OTHER PUBLICATIONS

English translation for KR 10-2018-0135342 A, Jul. 24, 2023, 11 pages (Year: 2023).*

*Primary Examiner* — Jimmy H Nguyen
(74) *Attorney, Agent, or Firm* — Innovation Counsel LLP

(57) ABSTRACT

Provided is a display apparatus includes a substrate including a first area and a second area; a first display element arranged in the first area; a second display element arranged in the second area; an input sensing layer disposed on the first display element and the second display element; an anti-reflection layer disposed on the input sensing layer; and a light blocking layer disposed on the anti-reflection layer, the light blocking layer having a first hole overlapping the emission area of the first display element and a second hole overlapping the emission area of the second display element, wherein an area of the first hole is greater than an area of the second hole.

19 Claims, 20 Drawing Sheets

(51) Int. Cl.
*H10K 59/38* (2023.01)
*H10K 59/40* (2023.01)

(52) U.S. Cl.
CPC ............... *G09G 2300/0842* (2013.01); *G09G 2320/068* (2013.01); *G09G 2358/00* (2013.01)

(56) References Cited

U.S. PATENT DOCUMENTS

| | | |
|---|---|---|
| 10,763,312 B2 | 9/2020 | Jo et al. |
| 2016/0378224 A1* | 12/2016 | Kwon .................... H10K 59/38 345/174 |
| 2020/0119113 A1* | 4/2020 | Lee .................... H10K 50/8445 |
| 2021/0118962 A1 | 4/2021 | Shin et al. |

FOREIGN PATENT DOCUMENTS

| | | |
|---|---|---|
| KR | 10-2018-0135342 A | 12/2018 |
| KR | 10-2021-0047499 A | 4/2021 |

* cited by examiner

DISPLAY APPARATUS

CROSS-REFERENCE TO RELATED APPLICATION

This application is based on and claims priority under 35 U.S.C. § 119 to Korean Patent Application No. 10-2021-0191798, filed on Dec. 29, 2021, in the Korean Intellectual Property Office, the disclosure of which is incorporated by reference herein in its entirety.

BACKGROUND

1. Field

The present disclosure generally relates to a display apparatus. More particularly, the present disclosure relates to a display apparatus capable of reducing side visibility.

2. Description of the Related Art

As the demand for display apparatuses expands, the need for display apparatuses capable of being used for various purposes is also increasing. Due to such a trend, display apparatuses tend to become larger or thinner. As display apparatuses are used in various fields, the demand for display apparatuses providing high-quality images is increasing.

SUMMARY

One or more embodiments include a display apparatus that lowers side visibility to minimize the risk of personal information exposure in public facilities and multi-use facilities. However, this is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus includes a substrate including a first area and a second area adjacent to the first area, a first display element arranged in the first area, a second display element arranged in the second area, an input sensing layer disposed on the first display element and the second display element, an anti-reflection layer disposed on the input sensing layer, the anti-reflection layer including color filters overlapping an emission area of the first display element and an emission area of the second display element respectively, and a light blocking layer disposed on the anti-reflection layer, a first hole overlapping the emission area of the first display element are defined in the light blocking layer and a second hole overlapping the emission area of the second display element, wherein an area of the first hole is greater than an area of the second hole.

In an embodiment, in a plan view, the first hole and the second hole may each have a circular shape, an elliptical shape, a polygonal shape, or a polygonal shape with rounded corners.

In an embodiment, the display apparatus may further include a pixel defining layer disposed on the substrate, a first opening corresponding to the emission area of the first display element and a second opening corresponding to the emission area of the second display element are defined in the pixel defining layer, and wherein, in a plan view, the first opening may be located in the first hole, and the second opening may be located in the second hole.

In an embodiment, a distance from an edge of the first opening to an edge of the first hole may be greater than a distance from an edge of the second opening to an edge of the second hole.

In an embodiment, an area of the first opening may be equal to or greater than an area of the second opening.

In an embodiment, the input sensing layer may include conductive mesh patterns having a plurality of mesh holes, and in a plan view, each of the first hole and the second hole is located in the plurality of mesh holes.

In an embodiment, in a plan view, the light blocking layer may cover the conductive mesh patterns.

In an embodiment, the light blocking layer may include a first partition dividing the first hole into a plurality of first sub-holes, and a second partition dividing the second hole into a plurality of second sub-holes, and an area of the first sub-hole may be greater than an area of the second sub-hole.

In an embodiment, the first sub-hole and the second sub-hole may each a circular shape, an elliptical shape, a polygonal shape, or a polygonal shape with rounded corners.

In an embodiment, the input sensing layer may include conductive mesh patterns having a plurality of mesh holes, a first dummy pattern surrounding at least a portion of the first sub-hole, and a second dummy pattern surrounding at least a portion of the second sub-hole, wherein, in a plan view, the first partition may at least partially overlap the first dummy pattern, and the second partition may at least partially overlap the second dummy pattern.

In an embodiment, the input sensing layer may include conductive mesh patterns having a plurality of mesh holes, and in a plan view, the plurality of first sub-holes may be located in one mesh hole, and the plurality of second sub-holes may be located in another mesh hole.

In an embodiment, a width of the first partition may be greater than a width of the first dummy pattern, and a width of the second partition may be greater than a width of the second dummy pattern.

In an embodiment, the display apparatus may further include a pixel defining layer disposed on the substrate, the pixel defining layer having a plurality of first sub-openings corresponding to a plurality of first sub-emission areas defined by dividing the emission area of the first display element, and a plurality of second sub-openings corresponding to a plurality of second sub-emission areas defined by dividing the emission area of the second display element, wherein, in a plan view, the first sub-opening may be located in the first sub-hole, and the second sub-opening may be located in the second sub-hole.

In an embodiment, a distance from an edge of the first sub-opening to an edge of the first sub-hole may be greater than a distance from an edge of the second sub-opening to an edge of the second sub-hole.

In an embodiment, an area of the first sub-opening may be equal to or greater than an area of the second sub-opening.

In an embodiment, the second display element may include a plurality of second display elements, emission areas of the plurality of second display elements may include neighboring emission areas through which pieces of light of different colors are emitted, the color filters may include a first color filter and a second color filter respectively arranged in the neighboring emission areas, and in a plan view, the first color filter and the second color filter may overlap each other in a region overlapping a portion of the light blocking layer corresponding thereto disposed between the neighboring emission areas.

In an embodiment, the input sensing layer may include conductive mesh patterns having a plurality of mesh holes, and the first color filter and the second color filter may overlap each other on the conductive mesh patterns.

In an embodiment, the anti-reflection layer may further include at least one overcoat layer disposed between the color filters and the light blocking layer.

In an embodiment, the first area may include a plurality of first areas, and the second area may include a plurality of second areas, and the plurality of first areas and the plurality of second areas may be alternatively arranged in a first direction.

In an embodiment, the display apparatus may further include a controller configured to control the first display element and the second display element to emit light in a first driving mode, and control the first display element not to emit light and the second display element to emit light in a second driving mode.

Other aspects, features, and advantages of the disclosure will become better understood through the accompanying drawings, the claims, and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
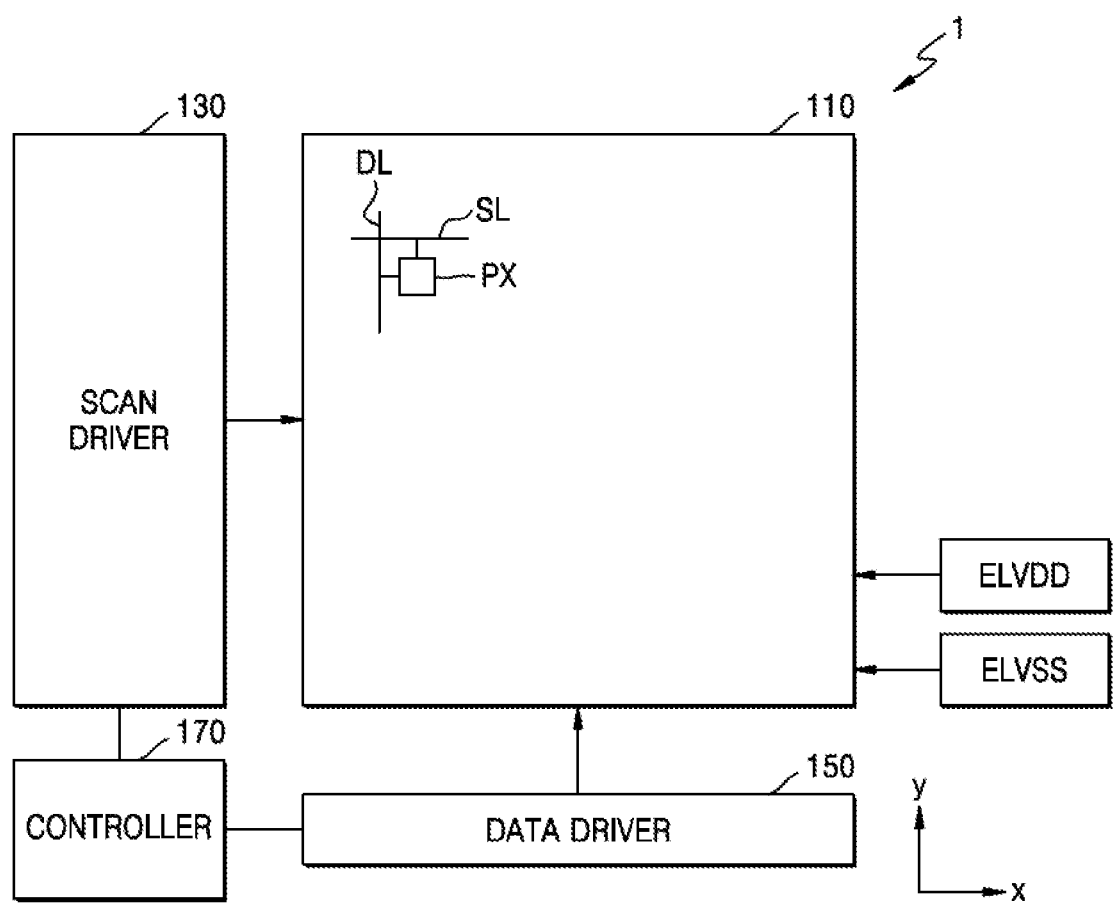
FIG. 1 is a diagram illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals.

It will be understood that although the specification, the "first," "second" etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "include" and/or "comprise" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. That is, for example, intervening layers, regions, or elements may be present.

It will be further understood that when layers, regions, or elements are referred to as being connected to each other, they may be directly connected to each other or indirectly connected to each other with intervening layers, regions, or elements therebetween. For example, when layers, regions, or elements are referred to as being electrically connected to each other, they may be directly electrically connected to each other or indirectly electrically connected to each other with intervening layers, regions, or elements therebetween.

In this specification, the expression "A and/or B" indicates only A, only B, or both A and B. In this specification, the expression "at least one of A and B" indicates only A, only B, or both A and B.

In the present specification, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order.

In addition, sizes of elements in the drawings may be exaggerated or reduced for convenience of explanation. For example, because sizes and thicknesses of elements in the drawings are arbitrarily illustrated for convenience of explanation, the disclosure is not limited thereto.

FIG. 1 is a diagram illustrating a display apparatus 1 according to an embodiment.

Referring to FIG. 1, the display apparatus 1 may include a display part 110, a scan driver 130, a data driver 150, and a controller 170.

A plurality of pixels PX and signal lines configured to respectively apply electrical signals to the pixels PX may be arranged on the display part 110.

The pixels PX may be repeatedly arranged in a first direction (x-direction or row direction) and a second direction (y-direction or column direction). The pixels PX may be arranged in various forms, such as a stripe arrangement, a pentile arrangement, or a mosaic arrangement, and may implement an image.

The signal lines configured to respectively apply electrical signals to the pixels PX may include a plurality of scan lines SL extending in the first direction (x-direction), a plurality of data lines DL extending in the second direction (y-direction), and the like. The scan lines SL may be spaced apart from each other in the second direction, and may be configured to transmit a scan signal to the pixels PX. The data lines DL may be apart from each other in the first direction, and may be configured to transmit a data signal to the pixels PX. Each of the pixels PX may be connected to at least one corresponding scan line SL among the scan lines SL and a corresponding data line DL among the data lines DL.

When the display apparatus 1 is an organic light-emitting display apparatus, a first power supply voltage ELVDD and a second power supply voltage ELVSS may be supplied to the pixels PX of the display part 110. The first power supply voltage ELVDD may be a high-level voltage provided to a first electrode (a pixel electrode or an anode) of a display element included in each of the pixels PX. The second power supply voltage ELVSS may be a low-level voltage provided to a second electrode (a common electrode or a cathode) of the display element included in each of the pixels P. The first power supply voltage ELVDD and the second power supply voltage ELVSS are driving voltages for allowing the pixels PX to emit light.

The scan driver 130 may be connected to the scan lines SL, and may be configured to generate a scan signal in response to a scan control signal from the controller 170 and sequentially supply the scan signal to the scan lines SL.

The data driver 150 may be connected to the data lines DL, and may be configured to supply the data signal to the data lines DL in response to a data control signal from the controller 170.

The controller 170 may be configured to generate the scan control signal and the data control signal based on external signals. The controller 170 may be configured to supply the scan control signal to the scan driver 130 and supply the data control signal to the data driver 150.

Hereinafter, an organic light-emitting display apparatus will be described as an example of the display apparatus according to the embodiment, but the display apparatus according to the disclosure is not limited thereto. In another embodiment, examples of the display apparatus according to the disclosure may include an inorganic light-emitting display (or an inorganic electroluminescence (EL) display), a quantum dot light-emitting display, and the like.

Figure 2:
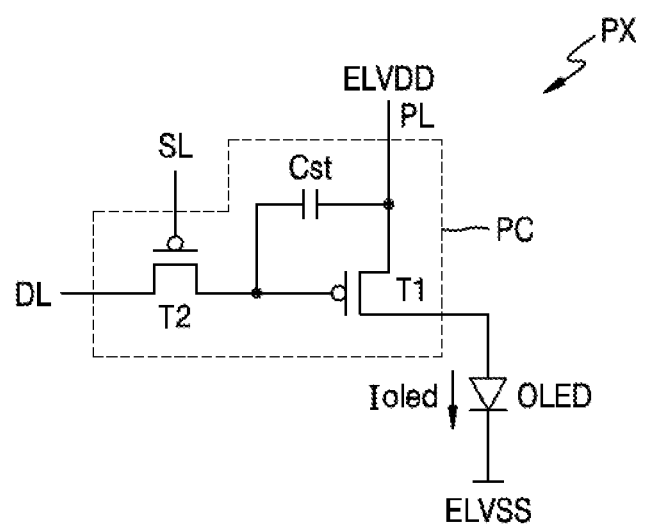
FIG. 2 is an equivalent circuit diagram of a pixel according to an embodiment.

FIG. 2 is an equivalent circuit diagram of a pixel PX according to an embodiment.

Referring to FIG. 2, the pixel PX may include a display element, such as an organic light-emitting diode OLED. The display element may be connected to a pixel circuit PC configured to drive the display element, and the pixel circuit PC may include a thin-film transistor TFT, a capacitor, and the like.

In an embodiment, the pixel circuit PC may include a first transistor T1, a second transistor T2, and a capacitor Cst. The pixels PX may each emit, for example, red light, green light, blue light, or white light from the organic light-emitting diode OLED. The first transistor T1 and the second transistor T2 may be implemented as thin-film transistors TFT.

The second transistor T2 acts as a switching transistor. The second transistor T2 may be connected to a scan line SL and a data line DL, and may be configured to transmit, to the first transistor T1, a data signal input from the data line DL in response to a scan signal input from the scan line SL. The capacitor Cst may be connected to the second transistor T2 and a driving voltage line PL, and may be configured to store a voltage corresponding to a difference between a voltage corresponding to the data signal received from the second transistor T2 and a first power supply voltage ELVDD supplied to the driving voltage line PL.

The first transistor T1 acts as a driving transistor. The first transistor T1 may be connected to the driving voltage line PL and the capacitor Cst, and may be configured to control a driving current $I_{oled}$ flowing from the driving voltage line PL to the organic light-emitting diode OLED according to a voltage value stored in the capacitor Cst. The organic light-emitting diode OLED may emit light having a certain luminance according to the driving current $I_{oled}$. A common electrode of the organic light-emitting diode OLED may be configured to receive a second power supply voltage ELVSS.

Although FIG. 2 illustrates that the pixel circuit PC includes two transistors and one capacitor, the disclosure is not limited thereto. Of course, the number of transistors and the number of capacitors may be variously changed according to the design of the pixel circuit PC.

Figure 3A:
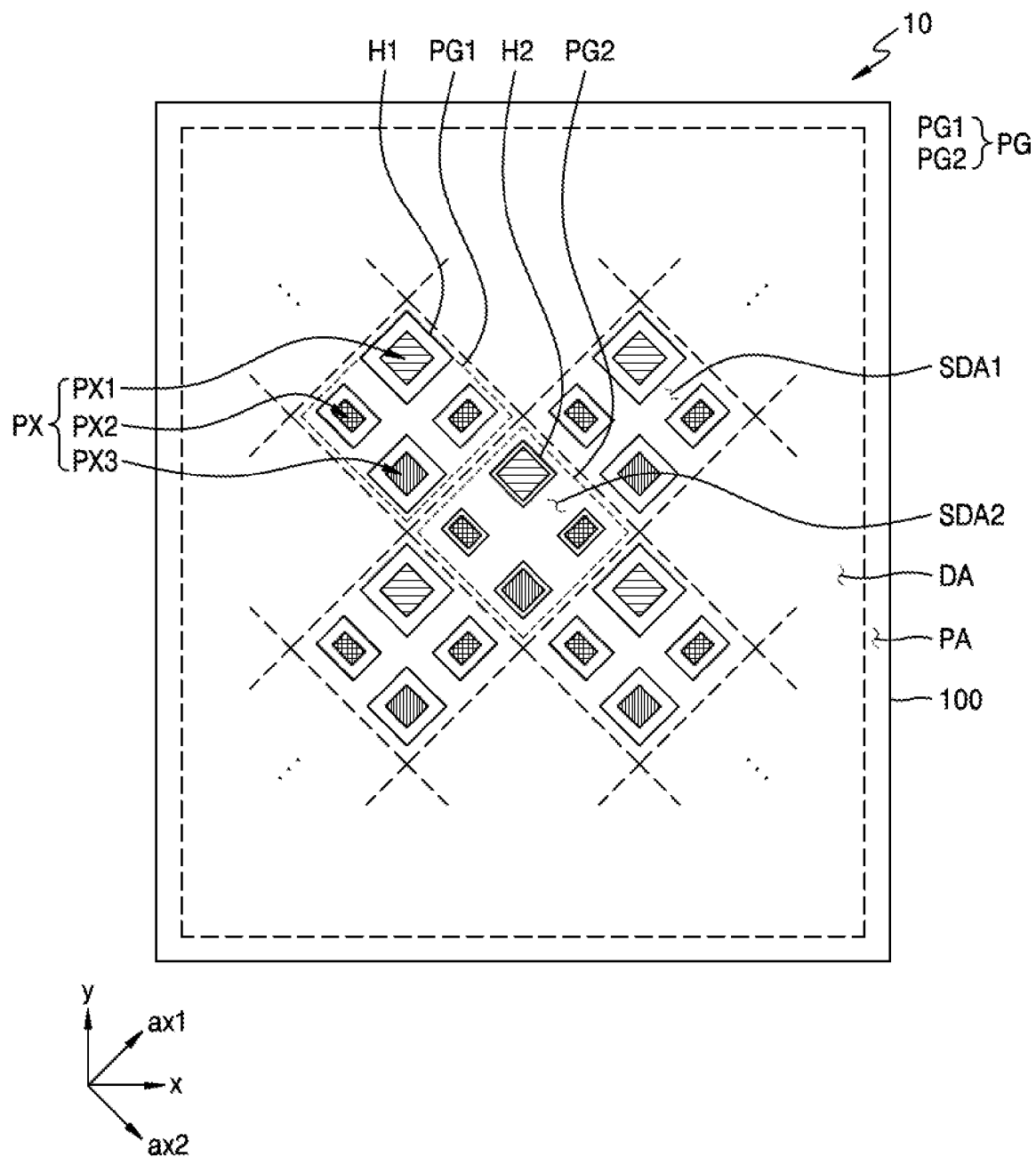
FIG. 3A is a plan view illustrating a display apparatus according to an embodiment.
Figure 3B:
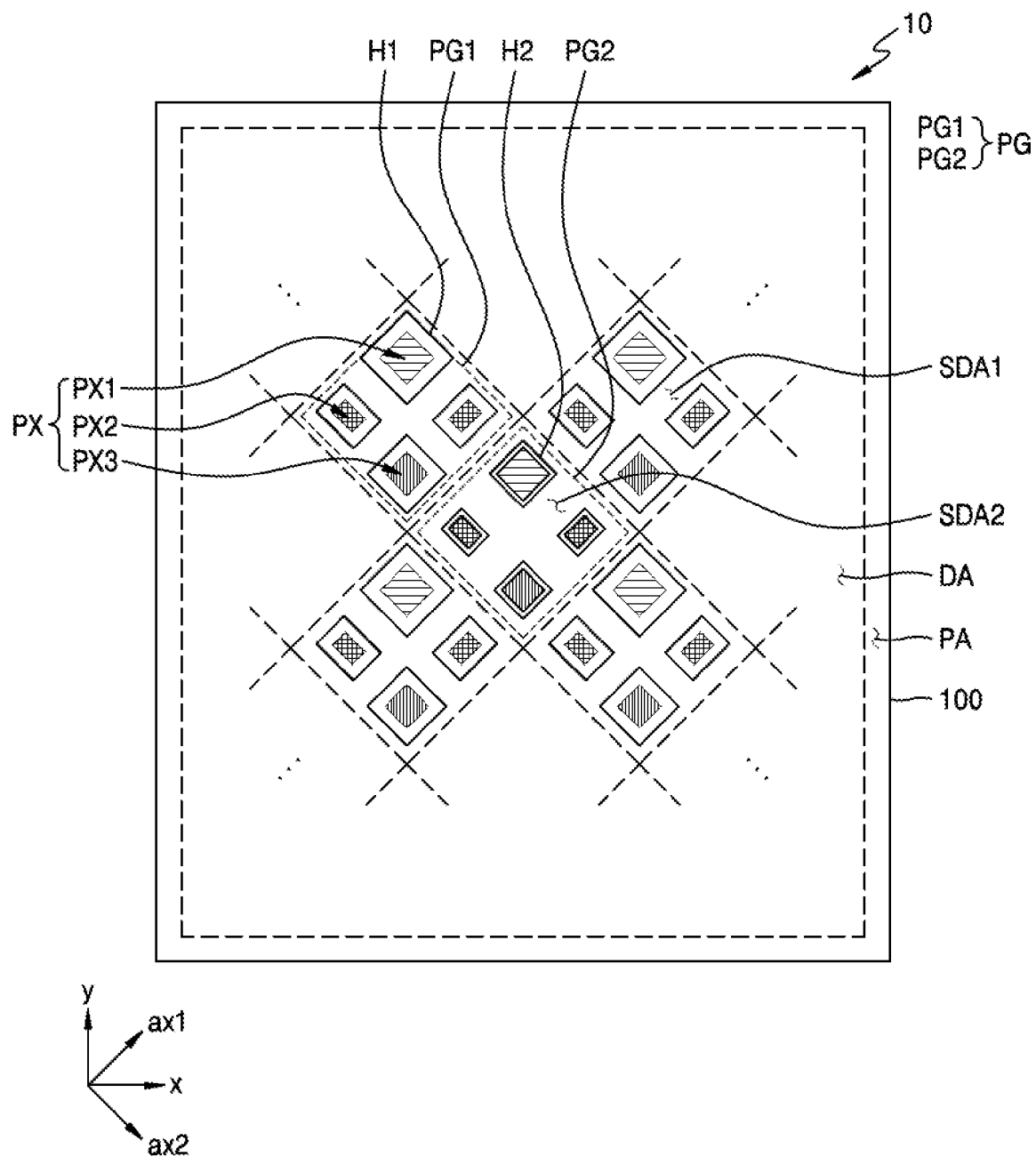
FIG. 3B is a diagram for describing driving of the display apparatus of FIG. 3A.

FIG. 3A is a plan view illustrating a display apparatus according to an embodiment, and FIG. 3B is a diagram for describing driving of the display apparatus of FIG. 3A.

Referring to FIG. 3A, the display apparatus may include a display panel 10. The display panel 10 may include a display area DA and a peripheral area PA outside the display area DA. The peripheral area PA may be a non-display area in which pixels PX are not arranged. The display area DA may be completely surrounded by the peripheral area PA. Various components constituting the display panel 10 are disposed on a substrate 100. Accordingly, it may be stated that the substrate 100 includes the display area DA and the peripheral area PA.

A plurality of pixels PX may be arranged in the display area DA. In a plan view, the pixel PX, as used herein, may be defined as an area configured to emit one of red light, green light, blue light, and white light in the display area DA.

The pixels PX may include a plurality of first pixels PX1 configured to display a first color, a plurality of second pixels PX2 configured to display a second color, and a plurality of third pixels PX3 configured to display a third color. In an embodiment, the first pixel PX1 may be a blue pixel, the second pixel PX2 may be a green pixel, and the third pixel PX3 may be a red pixel.

In the present specification, the sizes of the first pixel PX1, the second pixel PX2, and the third pixel PX3 may be the sizes of the areas configured to emit light, when the display panel 10 is viewed from above. For example, the display element implementing each pixel may have an emission area defined by an opening of a pixel defining layer, and a transmission area defined by a first hole H1 and a second hole H2 of a light blocking layer disposed on the display element. In the present specification, the size of each pixel means the size of the transmission area overlapping the display element implementing each pixel. Accordingly, the width of the transmission area may mean the width of the first hole H1 and the width of the second hole H2.

In the display area DA, pixel groups PG in which a certain number of pixels PX are grouped may be repeatedly arranged in a first direction and a second direction. The pixel groups PG may each include two second pixels PX2, one first pixel PX1, and one third pixel PX3. The pixel groups may include a first pixel group PG1 and a second pixel group PG2. In the display area DA, the first pixel group PG1 and the second pixel group PG2 may be alternately arranged in a third direction ax1 and a fourth direction ax2 crossing the first direction and the second direction. In an embodiment, the third direction ax1 may be perpendicular to the fourth direction ax2. In another embodiment, the third direction ax1 and the fourth direction ax2 may form an acute angle or an obtuse angle with each other. Accordingly, in the display area DA, a first area SDA1 in which the first pixel group PG1 is arranged and a second area SDA2 in which the second pixel group PG2 is arranged may be repeated in the third direction ax1 and the fourth direction ax2. The first pixel group PG1 and the second pixel group PG2 may have a shape in which two second pixels PX2, one first pixel PX1, and one third pixel PX3 are grouped in a rectangle. The first pixel group PG1 and the second pixel group PG2 are divided into repeating shapes and do not mean a structural disconnection.

When the arrangement structure of the display area DA is expressed differently, one of a plurality of first areas SDA1 may be surrounded by a plurality of second areas SDA2. In other words, one of the second areas SDA2 may be surrounded by the first areas SDA1.

The size (area) of the first area SDA1 may be equal to or different from the size (area) of the second area SDA2. FIG. 3A illustrates an example in which the size (area) of the first area SDA1 is equal to the size (area) of the second area SDA2.

In an embodiment, the arrangement of the first pixel PX1, the second pixel PX2, and the third pixel PX3 constituting the first pixel group PG1 may be the same as the arrangement of the first pixel PX1, the second pixel PX2, and the third pixel PX3 constituting the second pixel group PG2. The size (area) of each of the first pixel PX1, the second pixel PX2, and the third pixel PX3 in the first pixel group PG1 may be greater than the size (area) of each of the first pixel PX1, the second pixel PX2, and the third pixel PX3 corresponding thereto in the second pixel group PG2. That is, the size (area) of the transmission area of each of the first pixel PX1, the second pixel PX2, and the third pixel PX3 in the first pixel group PG1 may be greater than the size (area) of the transmission area of each of the first pixel PX1, the second pixel PX2, and the third pixel PX3 corresponding thereto in the second pixel group PG2. For example, the size (area) of the first hole H1 of the first pixel PX1 in the first pixel group PG1 may be greater than the size (area) of the second hole H2 of the first pixel PX1 in the second pixel group PG2.

When the viewing angle of each of the first pixel PX1, the second pixel PX2, and the third pixel PX3 in the first pixel group PG1 is 45 degrees or more, luminance may be 30% or more. However, when the viewing angle of each of the first pixel PX1, the second pixel PX2, and the third pixel PX3 in the second pixel group PG2 is 45 degrees or more, luminance may be 10% or less.

The peripheral area PA is an area in which pixels PX are not arranged, and no image is provided. Driving circuits configured to drive the pixels PX, for example, the scan driver 130, the data driver 150, the controller 170, and the power supply lines illustrated in FIG. 1, may be arranged in the peripheral area PA.

The display apparatus according to an embodiment may operate in a normal driving mode (a first mode) or a private driving mode (a second mode). The normal driving mode may be a mode that provides a wide viewing angle in all directions. The private driving mode is a mode that provides a narrow viewing angle in at least some directions, and may be a mode in which visibility from the side is narrow or blocked, compared with the normal driving mode. While the display apparatus is operating in the private driving mode, the viewing angle of another person, who views the display apparatus from the side, may be narrow or the view may be blocked. Therefore, personal information exposure may be prevented.

When the controller (170 of FIG. 1) receives a selection signal for selecting the normal driving mode or the private driving mode, the controller may output a control signal to the scan driver (130 of FIG. 1) and the data driver (150 of FIG. 1) so that the display apparatus operates in the normal driving mode or the private driving mode according to the selection signal.

In the normal driving mode, all of the first to third pixels PX1, PX2, and PX3 constituting the first pixel group PG1 and the second pixel group PG2 of the display area DA may be selected by a scan signal and may emit light with a luminance corresponding to a corresponding data signal.

As illustrated in FIG. 3B, in the private driving mode, the first to third pixels PX1, PX2, and PX3 constituting the first pixel group PG1 of the display area DA do not emit light, and only the first to third pixels PX1, PX2, and PX3 constituting the second pixel group PG2 may emit light with a luminance corresponding to a corresponding data signal. The non-emission of the pixels may include a case in which the pixel is not selected by a scan signal and thus does not receive a data signal, or a case in which the pixel is selected by the scan signal, but receives a black data signal and expresses black.

Figure 4:
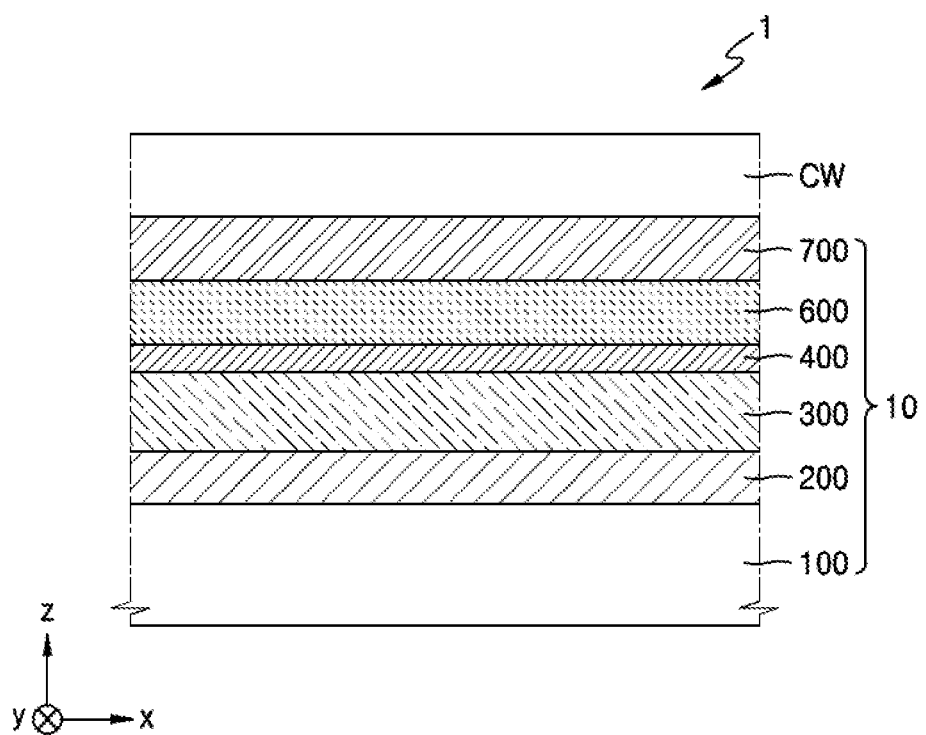
FIG. 4 is a cross-sectional view illustrating a portion of a display apparatus according to an embodiment.

FIG. 4 is a cross-sectional view illustrating a portion of a display apparatus 1 according to an embodiment.

Referring to FIG. 4, the display apparatus 1 may include a substrate 100, a display layer 200 disposed on the substrate 100 and including a TFT and a display element (e.g., a light-emitting diode), an encapsulation layer 300 covering the display layer 200, an input sensing layer 400, an anti-reflection layer 600, an optical function layer 700, and a cover window CW.

The substrate 100 may include glass or a polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In an embodiment, the substrate 100 may have a multi-layer structure including a base layer (not illustrated) and a barrier layer (not illustrated) each including the polymer resin described above. The substrate 100 including the polymer resin may be flexible, rollable, and bendable.

The display layer 200 may be disposed on the substrate 100. The display layer 200 may include a pixel circuit, and a display element electrically connected to the pixel circuit. The pixel circuit may include a plurality of TFTs and a plurality of storage capacitors. The display elements may each define a pixel.

The encapsulation layer 300 may be disposed on the display layer 200. In an embodiment, the encapsulation layer 300 may include at least one inorganic encapsulation layer and at least one organic encapsulation layer. The at least one inorganic encapsulation layer may include at least one inorganic material selected from aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymeric material. The polymeric material may include an acrylic resin, an epoxy resin, polyimide, polyethylene, and the like. In an embodiment, the at least one organic encapsulation layer may include acrylate.

In another embodiment, the encapsulation layer 300 may have a structure in which the substrate 100 and an upper substrate, which is a transparent member, are bonded to each other by a sealing member so as to seal an inner space between the substrate 100 and the upper substrate. In this case, a moisture absorbent or a filler may be located in the inner space. The sealing member (not shown herein) may be a sealant. In another embodiment, the sealing member may include a material that may be cured by a laser. For example, the sealing member may be frit. Specifically, the sealing member may include an organic sealant, such as a urethane-based resin, an epoxy-based resin, and an acrylic resin, or an inorganic sealant, such as silicone. Examples of the urethane-based resin may include urethane acrylate. Examples of the acrylic resin may include butyl acrylate and ethylhexyl acrylate. On the other hand, the sealing member may include a material that may be cured by heat.

The input sensing layer 400 may be disposed on the encapsulation layer 300. The input sensing layer 400 may be configured to obtain coordinate information according to an external input, for example, a touch event of an object, such as a finger or a stylus pen. The input sensing layer 400 may include a touch electrode and trace lines connected to the touch electrode. The input sensing layer 400 may be configured to sense an external input by using a mutual capacitance method or a self-capacitance method.

The anti-reflection layer 600 may be disposed on the input sensing layer 400. For example, the anti-reflection layer 600 may be disposed to be in contact with the input sensing layer 400. The anti-reflection layer 600 may reduce the reflectance of light (external light) incident from the outside toward the display panel 10. The anti-reflection layer 600 may include color filters respectively corresponding to the emission areas of the display elements, and an overcoat layer.

The optical function layer 700 may be disposed on the anti-reflection layer 600. In this case, the optical function layer 700 may include a light blocking layer that at least partially absorbs external light or internally reflected light. The light blocking layer may include a black pigment. The light blocking layer may include a black matrix. The light blocking layer may include a hole through which light emitted from a pixel arranged in a display area passes to the outside.

The cover window CW may be disposed on the display panel 10. In an embodiment, the cover window CW may be bonded to the optical function layer 700 by an adhesive, such as an optically clear adhesive (OCA). The cover window CW may include at least one of glass, sapphire, and plastic. The cover window CW may be, for example, ultra-thin glass (UTG) or colorless polyimide (CPI).

Figure 5:
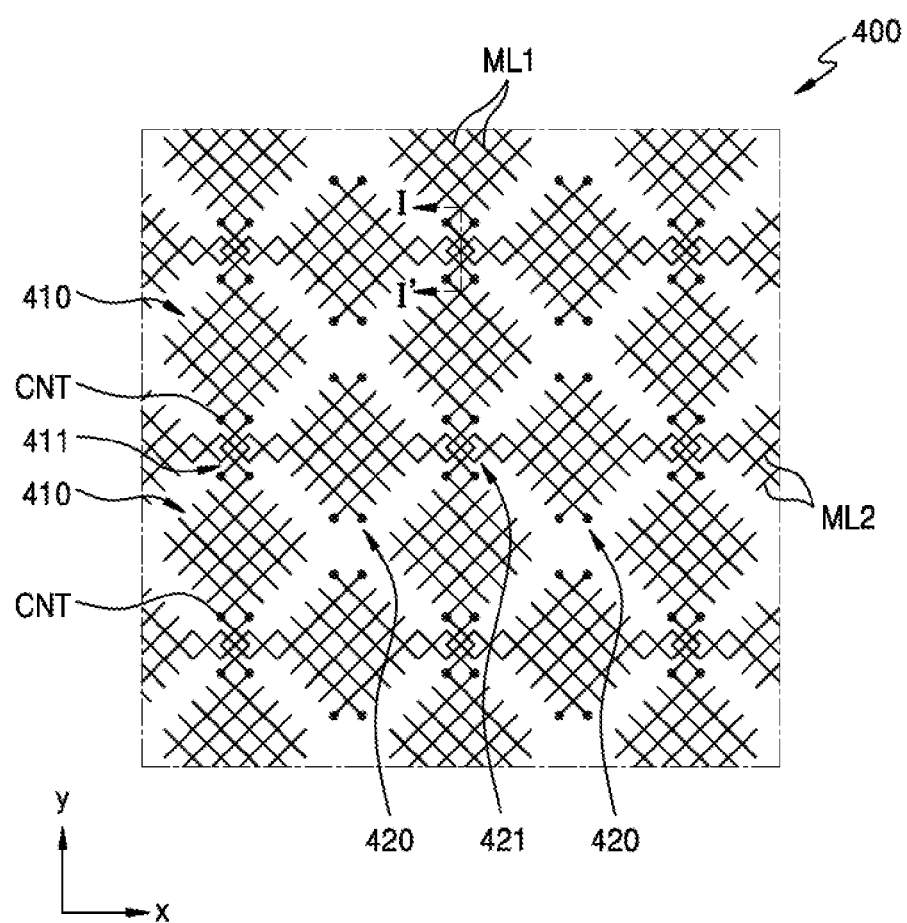
FIG. 5 is a plan view illustrating an input sensing layer of a display apparatus, according to an embodiment.
Figure 6:
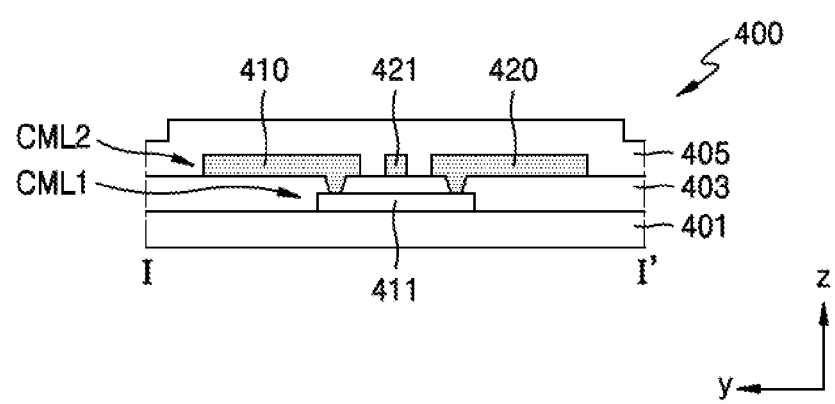
FIG. 6 is a cross-sectional view of the input sensing layer taken along line I-I' of FIG. 5 according to an embodiment.

FIG. 5 is a plan view illustrating an input sensing layer 400 of a display apparatus according to an embodiment, and FIG. 6 is a cross-sectional view of the input sensing layer 400 taken along line I-I' of FIG. 5 according to an embodiment.

Referring to FIGS. 5 and 6, the input sensing layer 400 may include a plurality of touch electrodes. In an embodiment, FIG. 5 illustrates that the touch electrodes include first touch electrodes 410 and second touch electrodes 420. The first touch electrodes 410 and the second touch electrodes 420 may be arranged to cross each other in a display area.

The first touch electrodes 410 may be arranged in the first direction (x-direction), and the second touch electrodes 420 may be arranged in the second direction (y-direction) crossing the first direction. The first touch electrodes 410 arranged in the first direction may be connected to each other by first connection electrodes 411 between the first touch electrodes 410 adjacent to each other. The second touch electrodes 420 arranged in the second direction may be connected to each other by second connection electrodes 421 between the second touch electrodes 420 adjacent to each other.

Figure 8:
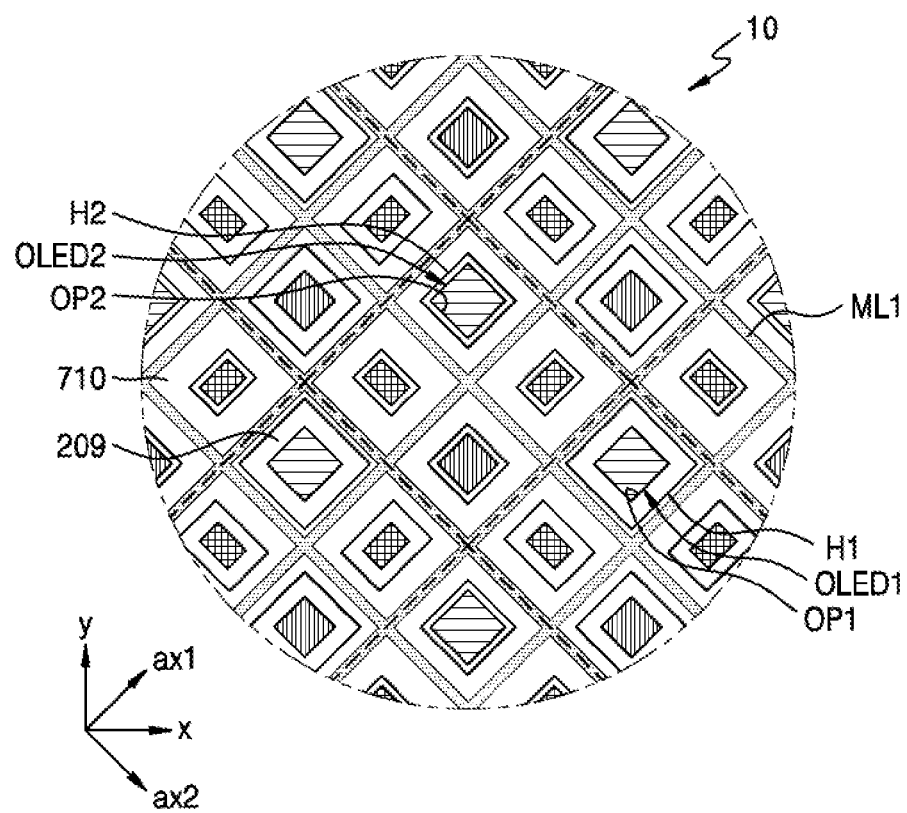
Figure 12:
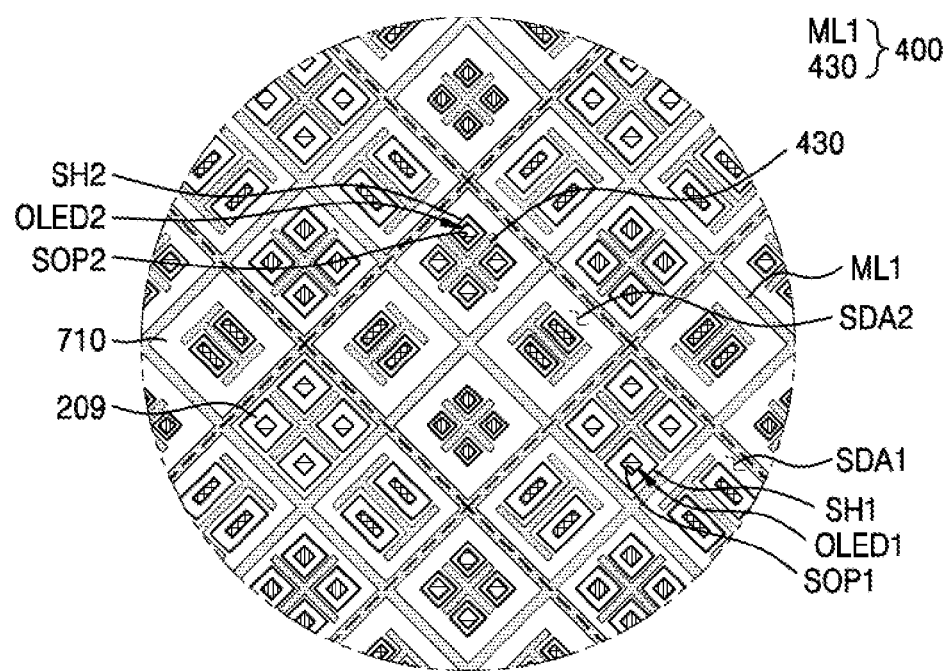

The first and second touch electrodes 410 and 420 may have a conductive mesh pattern, as illustrated in FIGS. 5, 8, and 12. For example, the conductive mesh pattern of the first touch electrode 410 may include a conductive line ML1 (hereinafter, referred to as a first conductive line), and the conductive mesh pattern of the second touch electrode 420 may include a conductive line ML2 (hereinafter, referred to as a second conductive line) insulated from the first conductive line ML1. The first and second conductive lines ML1 and ML2 may include molybdenum (Mo), mendelevium (Mb), silver (Ag), titanium (Ti), copper (Cu), aluminum (Al), and/or any alloy thereof.

Because the first and second touch electrodes 410 and 420 have the conductive mesh pattern, the first and second touch electrodes 410 and 420 may include holes (hereinafter, referred to as mesh holes), as illustrated in FIGS. 8, 9, 10, 11, and 12. The mesh holes may be defined as being completely surrounded by the corresponding conductive lines, and may be spaced apart from each other.

Like the first and second touch electrodes 410 and 420, the first and second connection electrodes 411 and 421 may also include conductive lines of conductive mesh patterns. The conductive lines of the first and second connection electrodes 411 and 421 may also include mesh holes, as illustrated in FIGS. 8, 9, 10, 11, 12.

As illustrated in FIG. 6, the input sensing layer 400 may include a first touch insulating layer 401, a first conductive layer CML1, a second touch insulating layer 403, a second conductive layer CML2, and a third touch insulating layer 405. The first conductive layer CML1 may include a first connection electrode 411, and the second conductive layer CML2 may include first and second touch electrodes 410 and 420 and a second connection electrode 421. In another embodiment, one of the first and second touch electrodes 410 and 420 may be provided in the first conductive layer CML1, and the other of the first and second touch electrodes 410 and 420 may be provided in the second conductive layer CML2. The first to third touch insulating layers 401, 403, and 405 may include an insulating material. In an embodiment, the first to third touch insulating layers 401, 403, and 405 may include an inorganic insulating material, such as silicon oxide, silicon nitride, and/or silicon oxynitride. In another embodiment, at least one of the first to third touch insulating layers 401, 403, and 405 may include an organic insulating material.

Figure 7A:
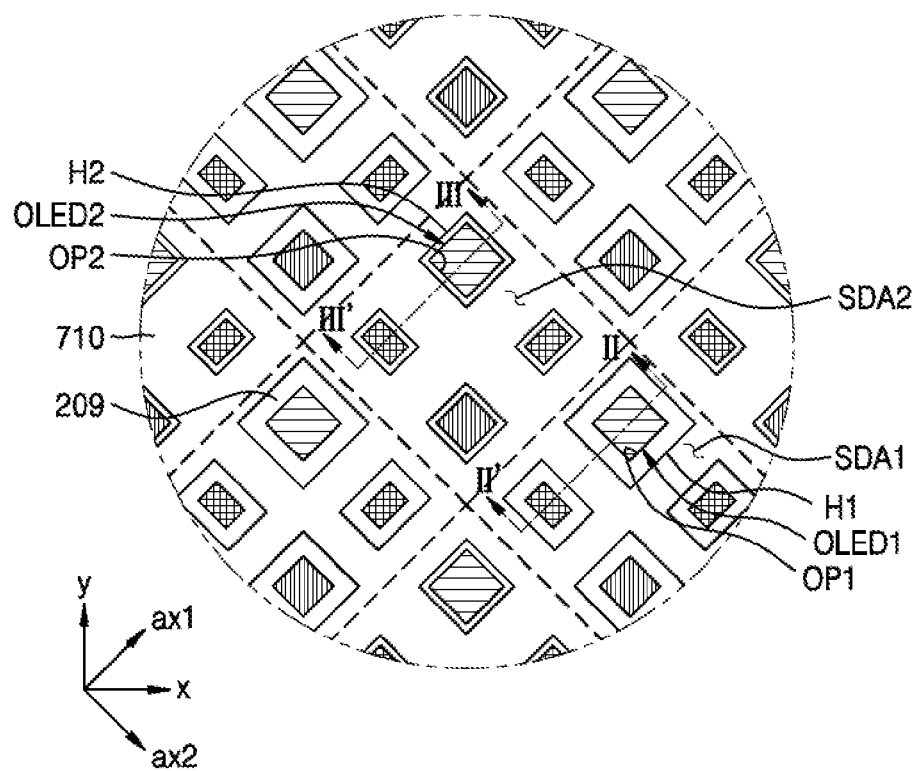
FIGS. 7A, 7B, and 8 are plan views illustrating a portion of a display apparatus according to an embodiment.
Figure 7B:
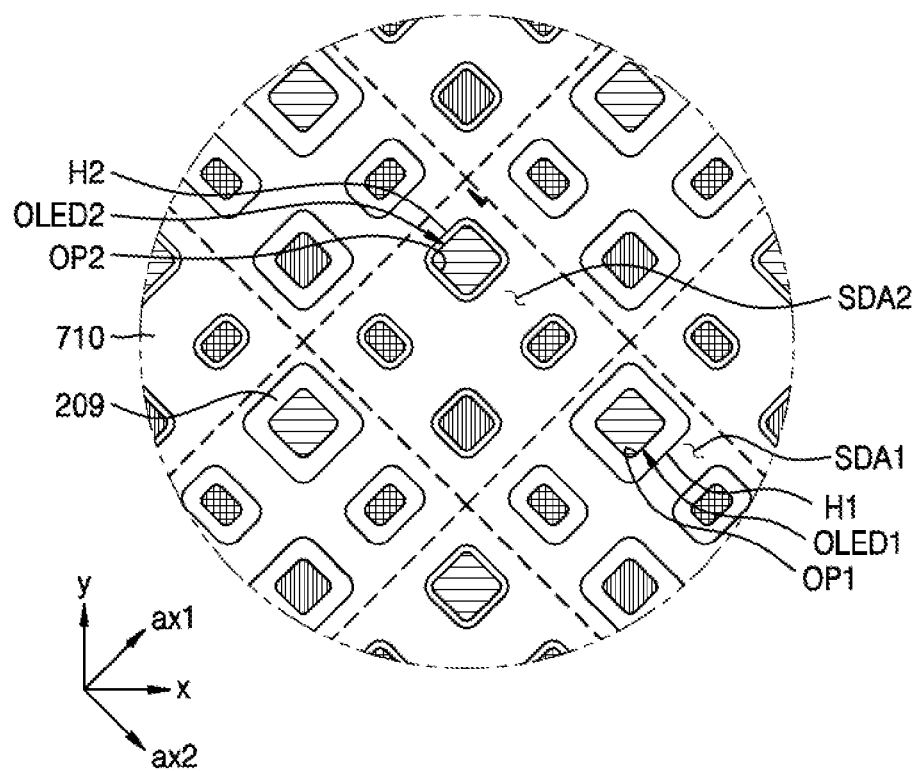
Figure 9:
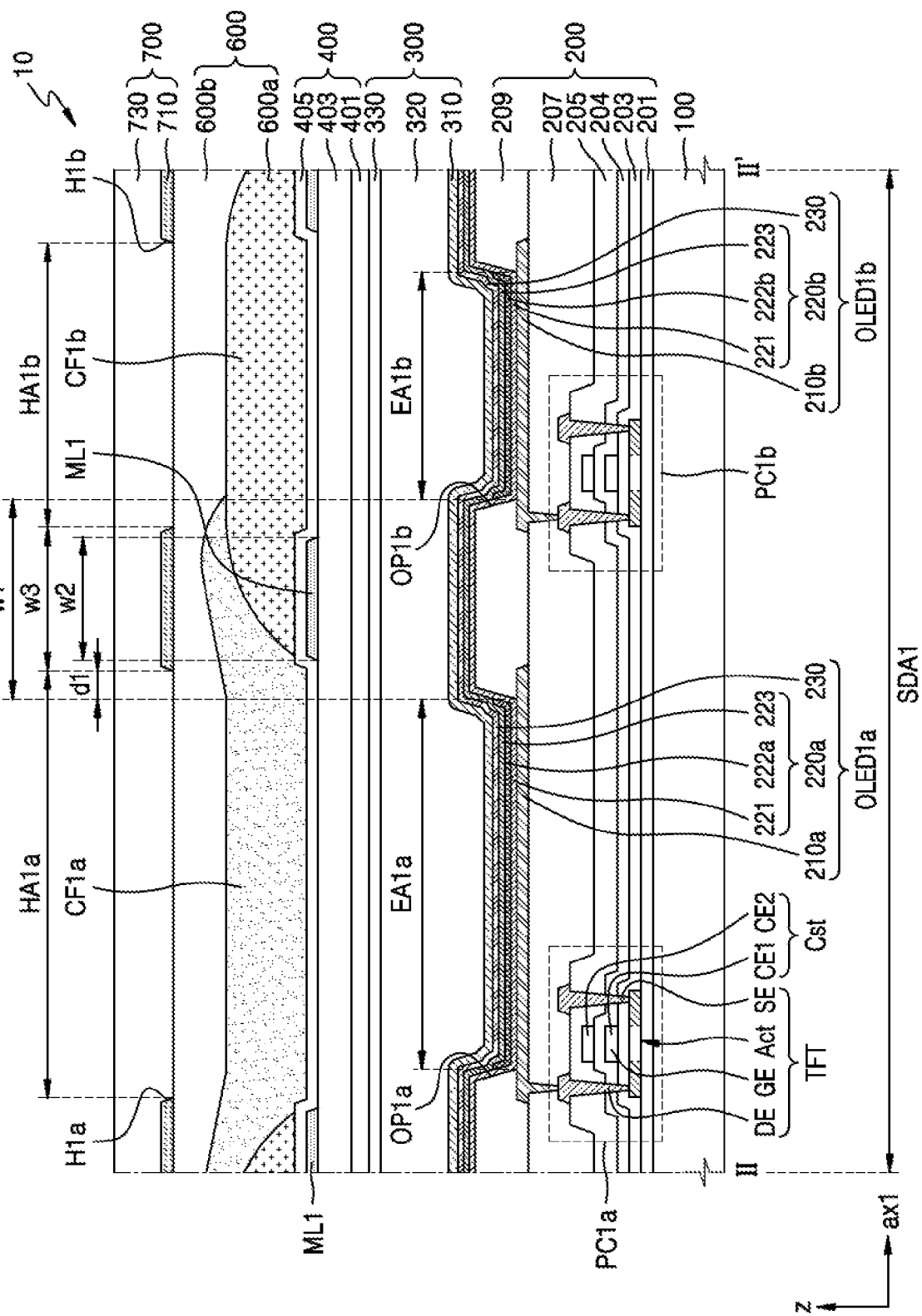
FIG. 9 is a cross-sectional view of the display apparatus taken along line II-II' of FIG. 7A according to an embodiment.
Figure 10:
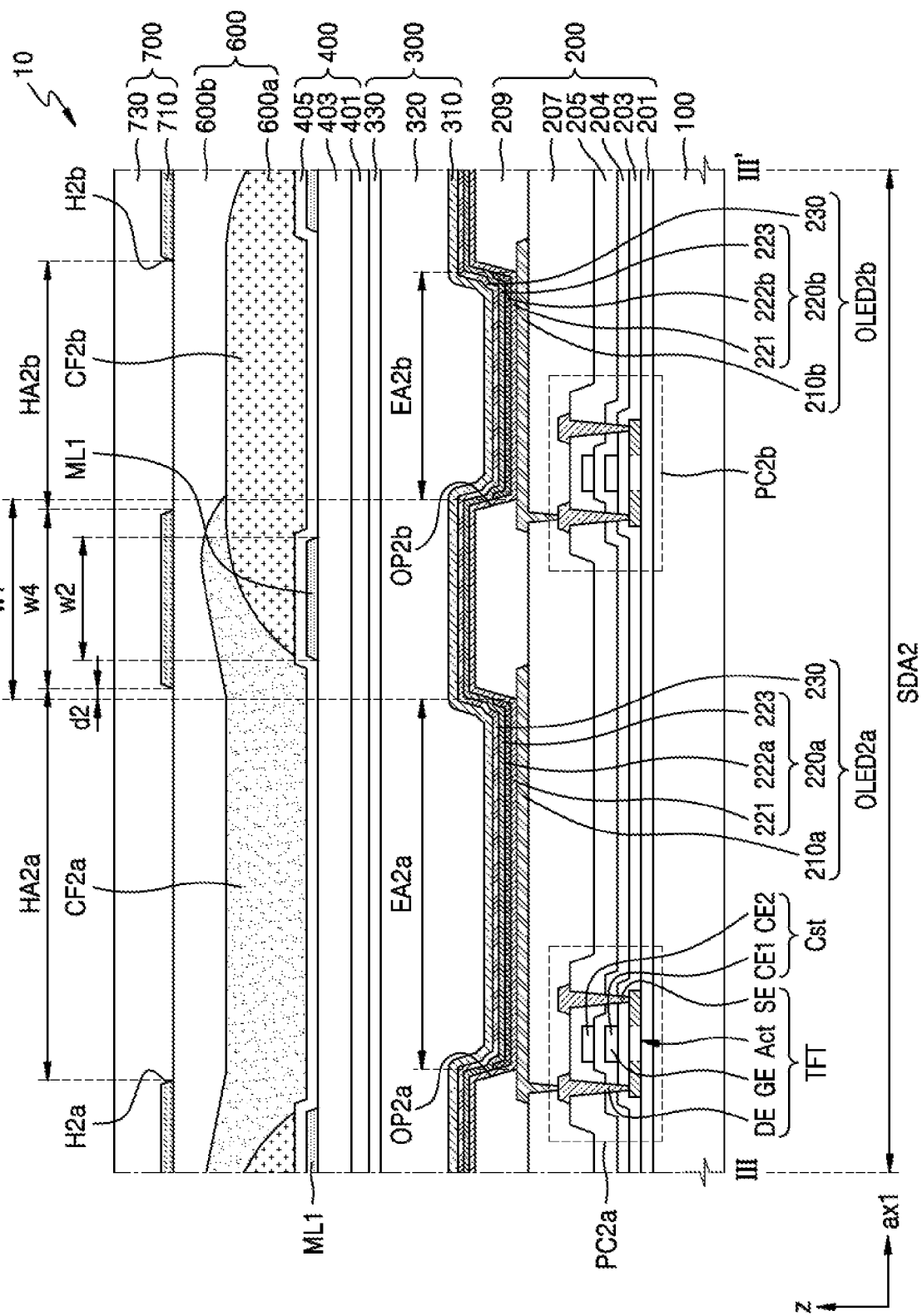
FIG. 10 is a cross-sectional view of the display apparatus taken along line III-III' of FIG. 7A, according to an embodiment.

FIGS. 7A, 7B, and 8 are plan views illustrating a portion of a display apparatus, according to an embodiment. FIG. 9 is a cross-sectional view of the display apparatus taken along line II-II' of FIG. 7A, according to an embodiment, and FIG. 10 is a cross-sectional view of the display apparatus taken along line III-III' of FIG. 7A, according to an embodiment.

In order to describe the planar shapes of pixels arranged in a first area SDA1 and a second area SDA2, FIGS. 7A and 7B illustrate a first organic light-emitting diode OLED1, a second organic light-emitting diode OLED2, a pixel defining layer 209, and a light blocking layer 710, and other components are omitted for convenience of illustration.

Referring to FIGS. 7A and 7B, the first organic light-emitting diode OLED1 may be arranged in the first area SDA1, and the second organic light-emitting diode OLED2 may be arranged in the second area SDA2. The first organic light-emitting diode OLED1 and the second organic light-emitting diode OLED2 may emit light of one of a red color, a green color, a blue color, and a white color. In an embodiment, a plurality of first organic light-emitting diodes OLED1 emitting pieces of light of different colors from each other may be arranged in the first area SDA1, and a plurality of second organic light-emitting diodes OLED2 emitting pieces of light of different colors from each other may be arranged in the second area SDA2.

The pixel defining layer 209 may be arranged in the first area SDA1 and the second area SDA2. The pixel defining layer 209 may have a first opening OP1 covering edges of a pixel electrode of the first organic light-emitting diode OLED1 and exposing a portion of the pixel electrode, and a second opening OP2 covering edges of a pixel electrode of the second organic light-emitting diode OLED2 and exposing a portion of the pixel electrode. That is, in the first area SDA1, one first opening OP1 may be defined for each pixel electrode by the pixel defining layer 209. Similarly, in the second area SDA2, one second opening OP2 may be defined for each pixel electrode by the pixel defining layer 209. The first opening OP1 may correspond to an emission area of the first organic light-emitting diode OLED1, and the second opening OP2 may correspond to an emission area of the second organic light-emitting diode OLED2. In a plan view, the first opening OP1 and the second opening OP2 may each have a circular shape, an elliptical shape, or a polygonal shape. The polygon may include a square, a rectangle, and a rhombus, and may have a round corner shape. In this regard, FIG. 7A illustrates the first opening OP1 and the second opening OP2 each having a rectangular shape, and FIG. 7B illustrates the first opening OP1 and the second opening OP2 each having a rectangular shape with round corners. In an embodiment, one of the first opening OP1 and the second opening OP2 may have a rectangular shape, and the other of the first opening OP1 and the second opening OP2 may have a rectangular shape with rounded corners.

The size (area) of the first opening OP1 corresponding to the emission area of the first organic light-emitting diode OLED1 may be equal to or greater than the size (area) of the second opening OP2 corresponding to the emission area of the second organic light-emitting diode OLED2 that emits light of the same color as that of the first organic light-emitting diode OLED1. Hereinafter, a case in which the size (area) of the first opening OP1 is equal to the size (area) of the second opening OP2, as illustrated in FIG. 7, will be mainly described in detail.

The light blocking layer 710 may be disposed on the pixel defining layer 209. As described above, the light blocking layer 710 may at least partially absorb external light or internally reflected light. The light blocking layer 710 may include a black pigment. The light blocking layer 710 may include a black matrix. A first hole H1 overlapping the first opening OP1 and a second hole H2 overlapping the second opening OP2 are defined in the light blocking layer 710. In a plan view, the first hole H1 and the second hole H2 may each have a circular shape, an elliptical shape, or a polygonal shape. The polygon may include a square, a rectangle, and a rhombus, and may have a round corner shape. In this regard, FIG. 7A illustrates the first hole H1 and the second hole H2 each having a rectangular shape, and FIG. 7B illustrates the first hole H1 and the second hole H2 each having a rectangular shape with rounded corners. In an embodiment, one of the first hole H1 and the second hole H2 may have a rectangular shape, and the other of the first hole H1 and the second hole H2 may have a rectangular shape with rounded corners.

The size (area) of the first hole H1 corresponding to the emission area of the first organic light-emitting diode OLED1 may be different from the size (area) of the second hole H2 overlapping the emission area of the second organic light-emitting diode OLED2 that emits light of the same color as that of the first organic light-emitting diode OLED1. In an embodiment, the size (area) of the first hole H1 may be greater than the size (area) of the second hole H2.

In a plan view, the first opening OP1 of the pixel defining layer 209 may be located in the first hole H1 of the light blocking layer 710. In other words, the emission area of the first organic light-emitting diode OLED1 may be completely exposed by the first hole H1 of the light blocking layer 710. Similarly, the second opening OP2 of the pixel defining layer 209 may be located in the second hole H2 of the light blocking layer 710. In other words, the emission area of the second organic light-emitting diode OLED2 may be completely exposed by the second hole H2 of the light blocking layer 710. In an embodiment, a distance from the edge of the first opening OP1 to the edge of the first hole H1 may be greater than a distance from the edge of the second opening OP2 to the edge of the second hole H2. Therefore, a viewing angle of the first organic light-emitting diode OLED1 may be greater than a viewing angle of the second organic light-emitting diode OLED2.

In order to describe the arrangement of the pixels arranged in the first area SDA1 and the second area SDA2 and the conductive mesh pattern of the input sensing layer 400, FIG. 8 illustrates the first organic light-emitting diode OLED1, the second organic light-emitting diode OLED2, the pixel defining layer 209, the light blocking layer 710, and the first conductive line ML1 of the input sensing layer 400, and other components are omitted for convenience of illustration. Although FIG. 8 illustrates the first conductive line ML1 as the conductive mesh pattern of the input sensing layer 400, the conductive mesh pattern may be the second conductive line ML2 according to a location thereof.

Referring to FIG. 8, as described above, the first conductive line ML1 may have a conductive mesh pattern and may include a mesh hole.

The first conductive line ML1 may be arranged to surround the emission area of the first organic light-emitting diode OLED1 and the emission area of the second organic light-emitting diode OLED2. In an embodiment, the first conductive line ML1 may be arranged along a boundary between the first area SDA1 and the second area SDA2. In an embodiment, the first conductive line ML1 may be disposed to cross over the first area SDA1 to have a plurality of mesh holes. In a plan view, the first openings OP1 of the pixel defining layer 209 may be arranged in the mesh holes. Similarly, the first conductive line ML1 may be disposed to cross over the second area SDA2 to have a plurality of mesh holes. In a plan view, the second openings OP2 of the pixel defining layer 209 may be arranged in the mesh holes.

The light blocking layer 710 may be disposed on the first conductive line ML1. In a plan view, the light blocking layer 710 may cover the first conductive line ML1. That is, in a plan view, the first conductive line ML1 may overlap the light blocking layer 710, and the first hole H1 and the second hole H2 of the light blocking layer 710 may be arranged in the mesh holes. Therefore, the light blocking layer 710 may reduce the reflection of light (external light) incident from the outside toward the display panel 10 due to the first conductive line ML1.

FIG. 9 illustrates two pixels adjacent to each other in a first area SDA1, and FIG. 10 illustrates two pixels adjacent to each other in a second area SDA2. As illustrated in FIG. 9, a display panel 10 may include a substrate 100, a display layer 200, an encapsulation layer 300, an input sensing layer 400, an anti-reflection layer 600, and an optical function layer 700.

Referring to FIG. 9, the substrate 100 may include glass or a polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In an embodiment, the substrate 100 may have a multi-layer structure including a base layer (not illustrated) and a barrier layer (not illustrated) each including the polymer resin described above. The substrate 100 including the polymer resin may be flexible, rollable, and bendable.

The display layer 200 may include a (1-1)th pixel circuit PC1a and a (1-2)th pixel circuit PC1b each including a thin-film transistor TFT and a storage capacitor Cst, a (1-1)th organic light-emitting diode OLED1a, a (1-2)th organic light-emitting diode OLED1b, a buffer layer 201, a first gate insulating layer 203, a second gate insulating layer 204, an interlayer insulating layer 205, an organic insulating layer 207, and a pixel defining layer 209. The (1-1)th organic light-emitting diode OLED1a may be arranged in the first area SDA1, and the (1-1)th pixel circuit PC1a may be electrically connected to the (1-1)th organic light-emitting diode OLED1a. Similarly, the (1-2)th organic light-emitting diode OLED1b may be arranged in the first area SDA1, and the (1-2)th pixel circuit PC1b may be electrically connected to the (1-2)th organic light-emitting diode OLED1b.

The buffer layer 201 may be on the substrate 100. The buffer layer 201 may include an inorganic insulating material, such as silicon nitride ($SiN_x$), silicon oxynitride (SiON), and silicon oxide ($SiO_2$), and may include a single layer or layers including the inorganic insulating material described above.

The thin-film transistor TFT may include a semiconductor layer Act, and the semiconductor layer Act may be disposed on the buffer layer 201. The semiconductor layer Act may include polysilicon. Alternatively, the semiconductor layer Act may include amorphous silicon, an oxide semiconductor, or an organic semiconductor. The semiconductor layer Act may include a channel region, and a drain region and a source region respectively on both sides of the channel region.

A gate electrode GE disposed on first gate insulating layer 203 may overlap the channel region. The gate electrode GE may include a low-resistance metal material. The gate electrode GE may include a conductive material including molybdenum (Mo), aluminum (Al), copper (Cu), titanium (Ti), and the like, and may include a single layer or layers including the conductive material described above.

The first gate insulating layer 203 between the semiconductor layer Act and the gate electrode GE may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

The second gate insulating layer 204 may be provided to cover the gate electrode GE. Similar to the first gate insulating layer 203, the second gate insulating layer 204 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

An upper electrode CE2 of the storage capacitor Cst may be disposed on the second gate insulating layer 204. The upper electrode CE2 may overlap the gate electrode GE therebelow. In this case, the gate electrode GE and the upper electrode CE2 overlapping each other with the second gate insulating layer 204 therebetween may constitute the storage capacitor Cst. That is, the gate electrode GE may function as a lower electrode CE1 of the storage capacitor Cst.

In an embodiment, the storage capacitor Cst may overlap the thin-film transistor TFT in a thickness direction (z-direction). In some embodiments, the storage capacitor Cst may not overlap the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or layers including the material described above.

The interlayer insulating layer 205 may cover the upper electrode CE2. The interlayer insulating layer 205 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 205 may include a single layer or layers including the inorganic insulating material described above.

A drain electrode DE and a source electrode SE may be disposed on the interlayer insulating layer 205. The drain electrode DE and the source electrode SE may include a material having good conductivity. The drain electrode DE and the source electrode SE may include a conductive material including molybdenum (Mo), aluminum (Al), copper (Cu), titanium (Ti), and the like, and may include a single layer or layers including the conductive material described above. In an embodiment, the drain electrode DE and the source electrode SE may have a multi-layer structure of Ti/Al/Ti.

The organic insulating layer 207 may be disposed to cover the drain electrode DE and the source electrode SE. The organic insulating layer 207 may include an organic insulating material, such as general-purpose polymer, such as polymethylmethacrylate (PMMA) or polystyrene (PS), polymer derivatives having a phenolic group, acrylic polymer, imide polymer, aryl ether polymer, amide polymer, fluorine polymer, p-xylene polymer, vinyl alcohol polymer, and any blend thereof. In some embodiments, the organic insulating layer 207 may include a first organic insulating layer and a second organic insulating layer.

The first organic light-emitting diode OLED1 may be disposed on the organic insulating layer 207. The first organic light-emitting diode OLED1 may emit red light, green light, or blue light, or may emit red light, green light, blue light, or white light. Hereinafter, a case in which the first organic light-emitting diode OLED1 includes the (1-1)th organic light-emitting diode OLED1a emitting blue light and the (1-2)th organic light-emitting diode OLED1b emitting green light, the first organic light-emitting diode OLED1 and the second organic light-emitting diode OLED2 being adjacent to each other, will be mainly described in detail.

The (1-1)th organic light-emitting diode OLED1a may include a pixel electrode 210a, an intermediate layer 220a, and a common electrode 230. The (1-2)th organic light-emitting diode OLED1b may include a pixel electrode 210b, an intermediate layer 220b, and a common electrode 230.

The pixel electrode 210a of the (1-1)th organic light-emitting diode OLED1a and the pixel electrode 210b of the (1-2)th organic light-emitting diode OLED1b may be disposed on the organic insulating layer 207. The pixel electrode 210a of the (1-1)th organic light-emitting diode OLED1a and the pixel electrode 210b of the (1-2)th organic light-emitting diode OLED1b may be electrically connected to the corresponding thin-film transistors TFT through contact holes penetrating the organic insulating layer 207, respectively. The pixel electrode 210a of the (1-1)th organic light-emitting diode OLED1a and the pixel electrode 210b of the (1-2)th organic light-emitting diode OLED1b may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 210a of the (1-1)th organic light-emitting diode OLED1a and the pixel electrode 210b of the (1-2)th organic light-emitting diode OLED1b may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In an embodiment, the pixel electrodes 210a and 210b may each further include a layer including ITO, IZO, ZnO, or $In_2O_3$ above and/or below the reflective layer. For example, the pixel electrodes 210a and 210b may each have a multi-layer structure of ITO/Ag/ITO.

The pixel defining layer 209 may cover the edges of the pixel electrode 210a of the (1-1)th organic light-emitting diode OLED1a and the pixel electrode 210b of the (1-2)th organic light-emitting diode OLED1b. For example, a (1-1)th opening OP1a and a (1-2)th opening OP1b are formed in the pixel defining layer 209. The (1-1)th opening OP1a may expose a central portion of the pixel electrode 210a of the (1-1)th organic light-emitting diode OLED1a. Similarly, the (1-2)th opening OP1b may expose a central portion of the pixel electrode 210b of the (1-2)th organic light-emitting diode OLED1b. As illustrated in FIG. 9, the (1-1)th opening OP1a may define an emission area EA1a of the (1-1)th organic light-emitting diode OLED1a, and the (1-2)th opening OP1b may define an emission area EA1b of the (1-2)th organic light-emitting diode OLED1b.

The intermediate layer 220a may include a first functional layer 221, a (1-1)th emission layer 222a, a (1-2)th emission layer 222b, and a second functional layer 223. The (1-1)th emission layer 222a may be disposed to correspond to the pixel electrode 210a of the (1-1)th organic light-emitting diode OLED1a, and the (1-2)th emission layer 222b may be disposed to correspond to the pixel electrode 210b of the (1-2)th organic light-emitting diode OLED1b. The (1-1)th emission layer 222a and the (1-2)th emission layer 222b may each include a high molecular weight organic material or a low molecular weight organic material that emits light of a certain color.

In an embodiment, at least one of the first functional layer 221 and the second functional layer 223 may be a common layer arranged completely in the display area. For example, the first functional layer 221 may include a hole transport layer (HTL), or may include an HTL and a hole injection layer (HIL). The second functional layer 223 may include an electron transport layer (ETL) and/or an electron injection layer (EIL). In an embodiment, the second functional layer 223 may be omitted.

The common electrode 230 may be disposed on the intermediate layer 220. The common electrode 230 may include a conductive material having a low work function. For example, the common electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the common electrode 230 may further include a layer, such as ITO, IZO, ZnO, or $In_2O_3$, on the (semi)transparent layer including the material described above.

In some embodiments, a capping layer (not illustrated) may be further disposed on the common electrode 230. The capping layer may include LiF, an inorganic material, and/or an organic material.

The encapsulation layer 300 may be disposed on the display layer 200. The encapsulation layer 300 may cover the (1-1)th organic light-emitting diode OLED1a and the (1-2)th organic light-emitting diode OLED1b. In an embodiment, the encapsulation layer 300 may include at least one inorganic encapsulation layer and at least one organic encapsulation layer. FIG. 9 illustrates that the encapsulation layer 300 includes a first inorganic encapsulation layer 310, an organic encapsulation layer 320, and a second inorganic encapsulation layer 330, which are sequentially stacked.

The at least one inorganic encapsulation layer may include at least one inorganic material selected from aluminum oxide ($Al_2O_3$), titanium oxide ($TiO_2$), tantalum oxide ($Ta_2O_5$), hafnium oxide ($HfO_2$), zinc oxide (ZnO), silicon oxide ($SiO_2$), silicon nitride ($SiN_x$), and silicon oxynitride (SiON). In an embodiment, the first inorganic encapsulation layer 310 may include silicon oxynitride (SiON). The second inorganic encapsulation layer 330 may include silicon nitride ($SiN_x$).

The at least one organic encapsulation layer 320 may include a polymeric material. The polymeric material may include an acrylic resin, an epoxy resin, polyimide, polyethylene, and the like. In an embodiment, the at least one organic encapsulation layer 320 may include acrylate.

The input sensing layer 400 may be disposed on the encapsulation layer 300. The input sensing layer 400 may include a first touch insulating layer 401, a second touch insulating layer 403, a first conductive line ML1, and a third touch insulating layer 405. In an embodiment, as illustrated in FIG. 9, the first conductive line ML1 may be disposed between the second touch insulating layer 403 and the third touch insulating layer 405. In another embodiment, the first conductive line ML1 may be disposed between the first touch insulating layer 401 and the second touch insulating layer 403. Hereinafter, a case in which the first conductive line ML1 is disposed between the second touch insulating layer 403 and the third touch insulating layer 405 will be mainly described in detail.

The first conductive line ML1 may be disposed to overlap the pixel defining layer 209 in the thickness direction (z-direction), as illustrated in FIG. 8. For example, the first conductive line ML1 may be disposed to overlap the pixel defining layer 209 surrounding the (1-1)th emission area EA1a and the (1-2)th emission area EA1b.

The anti-reflection layer 600 may be disposed on the input sensing layer 400. The anti-reflection layer 600 may include a color filter layer 600a and an overcoat layer 600b.

The color filter layer 600a may include a (1-1)th color filter CF1a and a (1-2)th color filter CF1b. The (1-1)th color filter CF1a may have a color corresponding to light emitted from the (1-1)th emission area EA1a, and the (1-2)th color filter CF1b may have a color corresponding to light emitted from the (1-2)th emission area EA1b. In an embodiment, when blue light is emitted from the (1-1)th emission area EA1a, the (1-1)th color filter CF1a may be a blue color filter, and when green light is emitted from the (1-2)th emission area EA1b, the (1-2)th color filter CF1b may be a green color filter. Because the color filter layer 600a improves the light extraction efficiency of light extracted to the front of the display panel 10, the lifespan of the display apparatus may be secured even when the light blocking layer 710 is provided, so as to block visibility from the side.

The (1-1)th color filter CF1a may cover the (1-1)th emission area EA1a, and the (1-2)th color filter CF1b may cover the (1-2)th emission area EA1b. In an embodiment, in a plan view, an edge of the (1-1)th color filter CF1a may be located outside of the (1-1)th opening OP1a, and an edge of the (1-2)th color filter CF1b may be located outside of the (1-2)th opening OP1b. The (1-1)th color filter CF1a and the (1-2)th color filter CF1b, which are arranged adjacent to each other, may overlap a portion of the pixel defining layer 209 disposed between the (1-1)th opening OP1a and the (1-2)th opening OP1b. In an embodiment, the (1-1)th color filter CF1a and the (1-2)th color filter CF1b may overlap each other on the first conductive line ML1 in the thickness direction. Accordingly, the first conductive line ML1 may be covered with one or more color filters CF1a and CF1b having different colors from each other. Because the (1-1)th color filter CF1a and the (1-2)th color filter CF1b overlap each other on the first conductive line ML1, the reflectance of light (external light) incident from the outside toward the display panel 10 due to the first conductive line ML1 may be reduced. In this case, the (1-1)th color filter CF1a and the (1-2)th color filter CF1b may be covered with a portion of the light blocking layer 710 disposed between the (1-1)th emission area EA1a and the (1-2)th emission area EA1b.

The overcoat layer 600b may be disposed on the color filter layer 600a. The overcoat layer 600b may include a colorless light-transmitting material, such as an acrylic resin, and may planarize the unevenness of the upper surface of the color filter layer 600a, which is due to the overlapping between the (1-1)th color filter CF1a and the (1-2)th color filter CF1b. Also, the thickness of the overcoat layer 600b may be adjusted to control the distance between the (1-1)th and (1-2)th emission areas EA1a and EA1b and the light blocking layer 710.

The optical function layer 700 may be disposed on the anti-reflection layer 600. The optical function layer 700 may include the light blocking layer 710 and a planarization layer 730 for planarizing the upper surface of the light blocking layer 710.

As described above, the light blocking layer 710 may at least partially absorb external light or internally reflected light. The light blocking layer 710 may include a black pigment. The light blocking layer 710 may include a black matrix. The first holes H1 through which light emitted from the first organic light-emitting diode OLED1 is transmitted is defined in the light blocking layer 710. For example, A (1-1)th hole H1a defining a (1-1)th transmission area HA1a and a (1-2)th hole H1b defining a (1-2)th transmission area HA1b is formed in the light blocking layer 710. The (1-1)th transmission area HA1a may overlap the (1-1)th light emission area EA1a, and the (1-2)th transmission area HA1b may overlap the (1-2)th emission area EA1b in the thickness direction.

In an embodiment, in a plan view, the (1-1)th opening OP1a may be located in the (1-1)th hole H1a. Similarly, in a plan view, the (1-2)th opening OP1b may be located in the (1-2)th hole H1b. For example, one edge of the (1-1)th opening OP1a may be apart from the one edge of the (1-1)th hole H1a by a first distance d1.

In an embodiment, a width w1 of a portion of the pixel defining layer 209 disposed between the (1-1)th emission area EA1a and the (1-2)th emission area EA1b may be greater than a width w3 of a portion of the light blocking layer 710 disposed between the (1-1)th transmission area HA1a and the (1-2)th transmission area HA1b. Therefore, the (1-1)th emission area EA1a may be exposed through the (1-1)th hole H1a, and the (1-2)th emission area EA1b may be exposed through the (1-2)th hole H1b.

In an embodiment, a width w2 of the first conductive line ML1 overlapping a portion of the pixel defining layer 209 disposed between the (1-1)th emission area EA1a and the (1-2)th emission area EA1b may be less than the width w3 of a portion of the light blocking layer 710 disposed between the (1-1)th transmission area HA1a and the (1-2)th transmission area HA1b. Therefore, in a plan view, the first conductive line ML1 may be covered with the light blocking layer 710.

Referring to FIG. 10, the second organic light-emitting diode OLED2 arranged in the second area SDA2 may include a (2-1)th organic light-emitting diode OLED2a and a (2-2)th organic light-emitting diode OLED2b. Hereinafter, descriptions of components similar to or redundant to those described with reference to FIG. 9 will be omitted, and differences will be mainly described.

The pixel defining layer 209 may have a (2-1)th opening OP2a and a (2-2)th opening OP2b. The (2-1)th opening OP2a may expose a central portion of the pixel electrode 210a of the (2-1)th organic light-emitting diode OLED2a. Similarly, the (2-2)th opening OP2b may expose a central portion of the pixel electrode 210b of the (2-2)th organic light-emitting diode OLED2b. The (2-1)th opening OP2a may define an emission area EA2a of the (2-1)th organic light-emitting diode OLED2a, and the (2-2)th opening OP2b may define an emission area EA2b of the (2-2)th organic light-emitting diode OLED2b.

A (2-1)th hole H2a defining a (2-1)th transmission area HA2a and a (2-2)th hole H2b defining a (2-2)th transmission area HA2b is formed in the light blocking layer 710. The (2-1)th transmission area HA2a may overlap the (2-1)th light emission area EA2a, and the (2-2)th transmission area HA2b may overlap the (2-2)th emission area EA2b.

In an embodiment, in a plan view, the (2-1)th opening OP2a may be located in the (2-1)th hole H2a. Similarly, in a plan view, the (2-2)th opening OP2b may be located in the (2-2)th hole H2b. For example, one edge of the (2-1)th opening OP2a may be apart from the one edge of the (2-1)th hole H2a by a second distance d2. In this case, the second distance d2 may be less than the first distance d1 illustrated in FIG. 9. Therefore, light traveling from the (2-1)th organic light-emitting diode OLED2a in a direction crossing the thickness direction (z-direction) perpendicular to the upper surface of the substrate 100 may be further removed than light traveling from the (1-1)th organic light-emitting diode OLED1a in a direction crossing the thickness (z-direction) perpendicular to the upper surface of the substrate 100.

In an embodiment, when the (1-1)th organic light-emitting diode OLED1a and the (2-1)th organic light-emitting diode OLED2a emit the same color, the size (area) of the (1-1)th hole H1a may be greater than the size (area) of the (2-1)th hole H2a.

In an embodiment, a width w1 of a portion of the pixel defining layer 209 disposed between the (2-1)th emission area EA2a and the (2-2)th emission area EA2b may be greater than a width w4 of a portion of the light blocking layer 710 disposed between the (2-1)th transmission area HA2a and the (2-2)th transmission area HA2b. Therefore, the (2-1)th emission area EA2a may be exposed through the (2-1)th hole H2a, and the (2-2)th emission area EA2b may be exposed through the (2-2)th hole H2b. In an embodiment, a width w3 of a portion of the light blocking layer 710 disposed between the (1-1)th transmission area HA1a and the (1-2)th transmission area HA1b may be less than the width w4 of a portion of the light blocking layer 710 disposed between the (2-1)th transmission area HA2a and the (2-2)th transmission area HA2b.

In an embodiment, a width w2 of the first conductive line ML1 overlapping a portion of the pixel defining layer 209 disposed between the (2-1)th emission area EA2a and the (2-2)th emission area EA2b may be less than the width w4 of a portion of the light blocking layer 710 disposed between the (2-1)th transmission area HA2a and the (2-2)th transmission area HA2b. Therefore, in a plan view, the entire first conductive line ML1 may be covered with the light blocking layer 710.

Figure 11A:
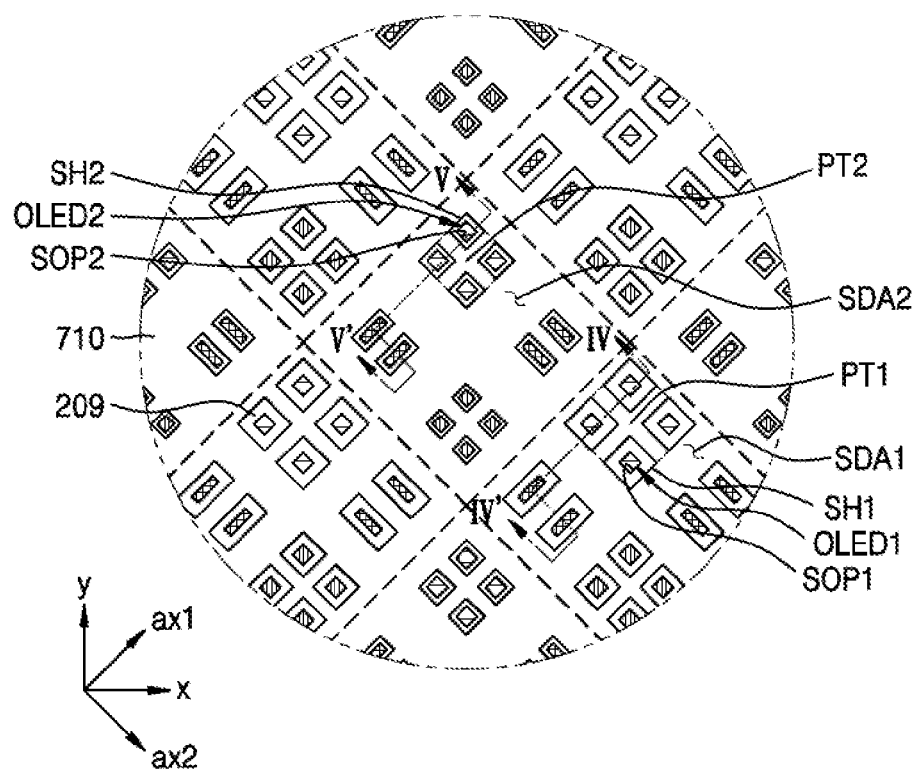
FIGS. 11A, 11B, and 12 are plan views illustrating a portion of a display apparatus, according to an embodiment.
Figure 11B:
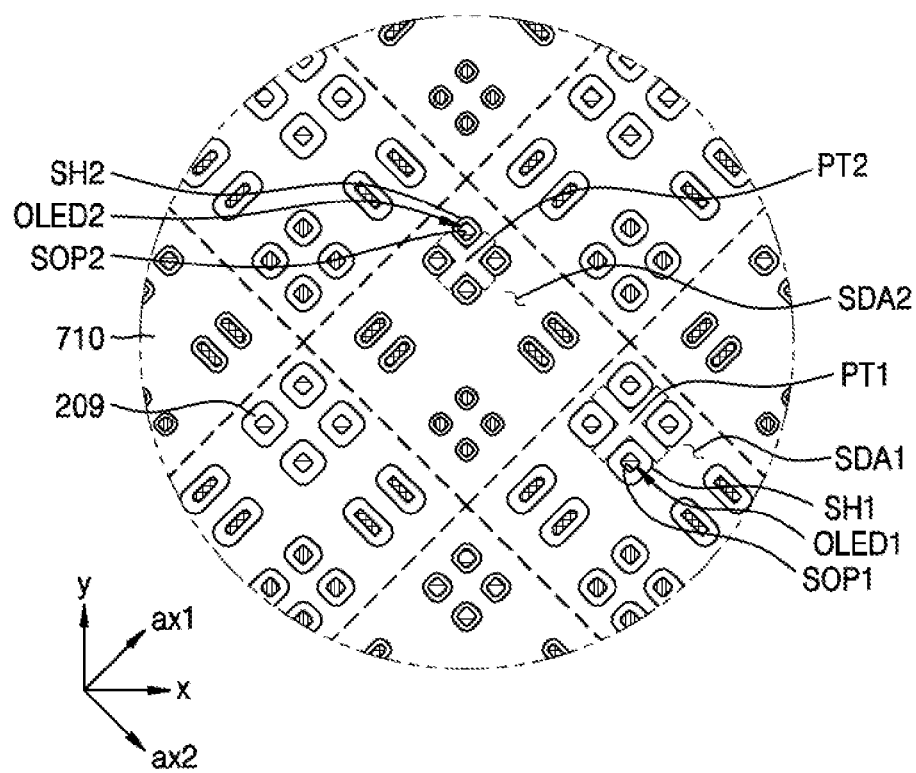
Figure 13:
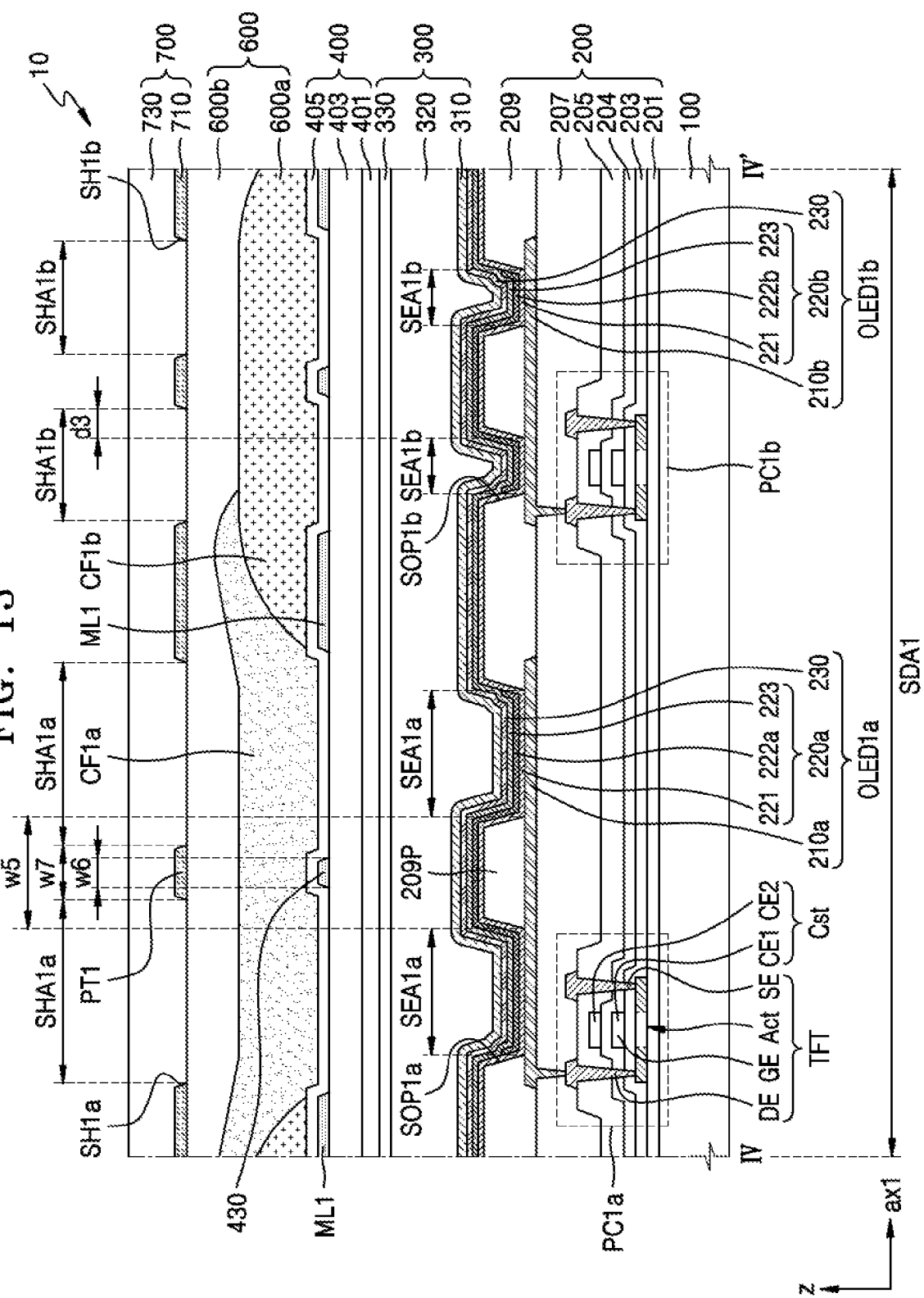
FIG. 13 is a cross-sectional view of the display apparatus taken along line IV-IV' of FIG. 11A according to an embodiment.
Figure 14:
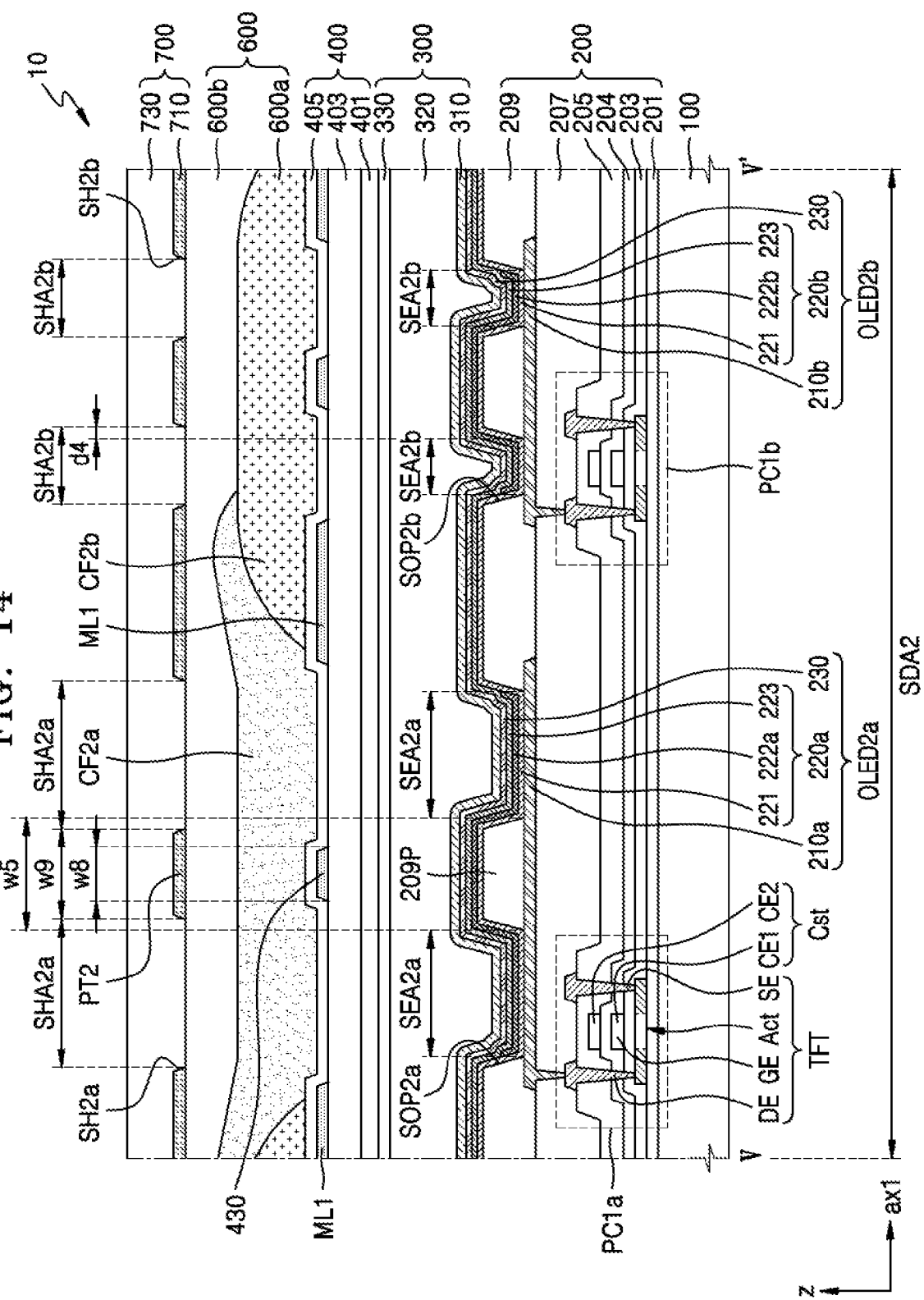
FIG. 14 is a cross-sectional view of the display apparatus taken along line V-V' of FIG. 11A according to an embodiment.

FIGS. 11A, 11B, and 12 are plan views illustrating a portion of a display apparatus according to an embodiment. FIG. 13 is a cross-sectional view of the display apparatus taken along line IV-IV' of FIG. 11A according to an embodiment, and FIG. 14 is a cross-sectional view of the display apparatus taken along line V-V' of FIG. 11A according to an embodiment.

FIGS. 11A and 11B are diagrams for describing the planar shapes of pixels arranged in a first area SDA1 and a second area SDA2. FIGS. 11A and 11B are similar to FIGS. 7A and 7B, but differ from FIGS. 7A and 7B in that a pixel defining layer 209 has first sub-openings SOP1 and second sub-openings SOP2 dividing one emission into a plurality of sub-emission areas, and a light blocking layer 710 has first sub-holes SH1 overlapping the first sub-openings SOP1 and second sub-holes SH2 overlapping the second sub-openings SOP2. Hereinafter, descriptions of similar or redundant components will be omitted, and differences will be mainly described.

Referring to FIGS. 11A and 11B, the pixel defining layer 209 may be arranged in the first area SDA1 and the second area SDA2. The pixel defining layer 209 may have the first sub-openings SOP1 exposing a portion of a pixel electrode of a first organic light-emitting diode OLED1. For example, the first sub-openings SOP1 may be defined by dividing an emission area corresponding to one pixel electrode of the first organic light-emitting diode OLED1 into a plurality of sub-emission areas. The pixel defining layer 209 may have the second sub-openings SOP2 exposing a portion of a pixel electrode of a second organic light-emitting diode OLED2. For example, the second sub-openings SOP2 may be defined by dividing an emission area corresponding to one pixel electrode of the second organic light-emitting diode OLED2 into a plurality of sub-emission areas. In a plan view, the first sub-opening SOP1 and the second sub-opening SOP2 may each have a circular shape, an elliptical shape, or a polygonal shape. The polygon may include a square, a rectangle, and a rhombus, and may have a rounded corner shape. In this regard, FIG. 11A illustrates the first sub-opening SOP1 and the second sub-opening SOP2 each having a rectangular shape, and FIG. 11B illustrates the first sub-opening SOP1 and the second sub-opening SOP2 each having a rectangular shape with rounded corners. In an embodiment, one of the first sub-opening SOP1 and the second sub-opening SOP2 may have a rectangular shape, and the other of the first sub-opening SOP1 and the second sub-opening SOP2 may have a rectangular shape with rounded corners.

The size (area) of each of the first sub-openings SOP1 dividing the emission area of the first organic light-emitting diode OLED1 may be equal to or greater than the size (area) of each of the second sub-openings SOP2 dividing the emission area of the second organic light-emitting diode OLED2 that emits the same color as that of the first organic light-emitting diode OLED1. Hereinafter, a case in which the size (area) of the first sub-opening SOP1 is equal to the size (area) of the second sub-opening SOP2, as illustrated in FIG. 11, will be mainly described in detail.

First sub-holes SH1 overlapping the first sub-openings SOP1 and second sub-holes SH2 overlapping the second sub-openings SOP2 are defined in the light blocking layer 710. For example, the light blocking layer 710 may have a first partition PT1 dividing the first hole H1 illustrated in FIG. 7 into a plurality of first sub-holes SH1 and a second partition PT2 dividing the second hole H2 illustrated in FIG. 7 into a plurality of second sub-holes SH2. In an embodiment, the light blocking layer 710 may have only the second partition PT2 dividing the second hole H2 into the second sub-holes SH2. In a plan view, the first sub-hole SH1 and the second sub-hole SH2 may each have a circular shape, an elliptical shape, or a polygonal shape. The polygon may include a square, a rectangle, and a rhombus, and may have a rounded corner shape. In this regard, FIG. 11A illustrates the first sub-hole SH1 and the second sub-hole SH2 each having a rectangular shape, and FIG. 11B illustrates the first sub-hole SH1 and the second sub-hole SH2 each having a rectangular shape with rounded corners. In an embodiment, one of the first sub-hole SH1 and the second sub-hole SH2 may have a rectangular shape, and the other of the first sub-hole SH1 and the second sub-hole SH2 may have a rectangular shape with rounded corners.

The size (area) of each of the first sub-holes SH1 overlapping the emission area of the first organic light-emitting diode OLED1 may be different from the size (area) of each of the second sub-holes SH2 overlapping the emission area of the second organic light-emitting diode OLED2 that emits light of the same color as that of the first organic light-emitting diode OLED1. In an embodiment, the size (area) of the first sub-hole SH1 may be greater than the size (area) of the second sub-hole SH2.

In a plan view, the first sub-opening SOP1 of the pixel defining layer 209 may be located in the first sub-hole SH1 of the light blocking layer 710 overlapping the first sub-opening SOP1. Similarly, the second sub-opening SOP2 of the pixel defining layer 209 may be located in the second sub-hole SH2 of the light blocking layer 710 overlapping the second sub-opening SOP2. In an embodiment, a distance from one edge of the first sub-opening SOP1 to one edge of the first sub-hole SH1 may be greater than a distance from one edge of the second sub-opening SOP2 to one edge of the second sub-hole SH2. Therefore, a viewing angle of the first organic light-emitting diode OLED1 may be greater than a viewing angle of the second organic light-emitting diode OLED2.

In order to describe the arrangement of pixels arranged in a first area SDA1 and a second area SDA2 and the arrangement of a conductive mesh pattern and a dummy pattern of an input sensing layer 400, FIG. 12 illustrates a first organic light-emitting diode OLED1, a second organic light-emitting diode OLED2, a pixel defining layer 209, a light blocking layer 710, and a first conductive line ML1 and a dummy pattern 430 of the input sensing layer 400, and other components are omitted for convenience of illustration. Although FIG. 12 illustrates the first conductive line ML1 as the conductive mesh pattern of the input sensing layer 400, the conductive mesh pattern may be the second conductive line ML2 according to a location thereof.

Referring to FIG. 12, the first conductive line ML1 may have a conductive mesh pattern and may include a mesh hole. In an embodiment, the first conductive line ML1 may be disposed to cross over the first area SDA1 to have a plurality of mesh holes. In a plan view, first sub-openings SOP1 of the pixel defining layer 209 may be arranged in the mesh holes. Similarly, the first conductive line ML1 may be disposed to cross over the second area SDA2 to have a plurality of mesh holes. In a plan view, the second sub-openings SOP2 of the pixel defining layer 209 may be arranged in the mesh holes.

The dummy pattern 430 may be arranged to surround at least a portion of the first sub-openings SOP1 and the second sub-openings SOP2. For example, the dummy pattern 430 may be disposed to overlap a portion of the pixel defining layer 209 between the first sub-openings SOP1 adjacent to each other and a portion of the pixel defining layer 209 between the second sub-openings SOP2 adjacent to each other.

In an embodiment, the dummy pattern 430 may be provided in the first conductive layer (CML1 of FIG. 6). In another embodiment, the dummy pattern 430 may be provided in the second conductive layer (CML2 of FIG. 6). In another embodiment, a portion of the dummy pattern 430 may be provided in the first conductive layer CML1, and another portion of the dummy pattern 430 may be provided in the second conductive layer CML2. The dummy pattern 430 may be insulated from the first conductive line ML1 and the second conductive line (ML2 of FIG. 6). For example, the dummy pattern 430 may be arranged spaced apart from the conductive mesh pattern in the mesh hole.

The light blocking layer 710 may be disposed on the first conductive line ML1, and may cover the first conductive line ML1 and the dummy pattern 430 in a plan view. That is, in a plan view, the first conductive line ML1 and the dummy pattern 430 may overlap the light blocking layer 710, and the first sub-hole SH1 and the second sub-hole SH2 of the light blocking layer 710 may be at least partially surrounded by the first conductive line ML1 and the dummy pattern 430, respectively. For example, in a plan view, the first partition PT1 and the second partition PT2 of the light blocking layer 710 may cover the dummy pattern 430. Therefore, the light blocking layer 710 may reduce the reflection of light (external light) incident from the outside toward the display panel 10 due to the first conductive line ML1 and the dummy pattern 430.

Referring to FIG. 13, (1-1)th sub-openings SOP1a exposing portions of a pixel electrode 210a of a (1-1)th organic light-emitting diode OLED1a and (1-2)th sub-openings SOP1b exposing portions of a pixel electrode 210b of a (1-2)th organic light-emitting diode OLED1b are defined in the pixel defining layer 209. For example, a portion 209P of the pixel defining layer 209 may be disposed on the pixel electrode 210a of the (1-1)th organic light-emitting diode OLED1a so that the (1-1)th emission area (see EA1a of FIG. 9) corresponding to the pixel electrode 210a may be divided into a plurality of (1-1)th sub-emission areas SEA1a.

The input sensing layer 400 may include a dummy pattern 430. In an embodiment, the dummy pattern 430 may be arranged on the same layer as a first conductive line ML1. The dummy pattern 430 overlaps the pixel defining layer 209 in the thickness direction (z-direction). For example, the dummy pattern 430 may be disposed between a second touch insulating layer 403 and a third touch insulating layer 405. In another embodiment, the dummy pattern 430 may be disposed between a first touch insulating layer 401 and a second touch insulating layer 403. In another embodiment, a portion of the dummy pattern 430 may be disposed between the first touch insulating layer 401 and the second touch insulating layer 403, and the remaining portions of the dummy pattern 430 may be disposed between the second touch insulating layer 403 and the third touch insulating layer 405.

The light blocking layer 710 may have (1-1)th sub-holes SH1a through which light emitted from the (1-1)th organic light-emitting diode OLED1a is transmitted and (1-2)th sub-holes SH1b through which light emitted from the (1-2)th organic light-emitting diode OLED1b is transmitted. For example, the (1-1)th sub-holes SH1a may define (1-1)th sub-transmission areas SHA1a, and the (1-2)th sub-holes SH1b may define (1-2)th sub-transmission areas SHA1b. The (1-1)th sub-transmission area SHA1a may overlap the (1-1)th sub-emission area SEA1a, and the (1-2)th sub-transmission area SHA1b may overlap the (1-2)th sub-emission area SEA1b.

In an embodiment, in a plan view, the (1-1)th sub-opening SOP1a may be located in the (1-1)th sub-hole SH1a. For example, an edge of the (1-1)th sub-opening SOP1a may be spaced apart from the an edge of the (1-1)th sub-hole SH1a by a third distance d3. Similarly, the (1-2)th sub-opening SOP1b may be located in the (1-2)th sub-hole SH1b.

In an embodiment, a width w5 of the portion 209P of the pixel defining layer 209 disposed between the (1-1)th sub-emission areas SEA1a adjacent to each other may be greater than a width w7 of a first partition PT1 disposed between the (1-1)th sub-transmission areas SHA1a. Therefore, the (1-1)th sub-emission areas SEA1a may be exposed through the (1-1)th sub-holes SH1a. Similarly, the (1-2)th sub-emission areas SEA1b may be exposed through the (1-2)th sub-holes SH1b.

In an embodiment, a width w6 of the dummy pattern 430 overlapping the portion 209P of the pixel defining layer 209 disposed between the (1-1)th sub-emission areas SEA1a adjacent to each other may be less than the width w7 of the first partition PT1 between the (1-1)th sub-transmission areas SHA1a. Therefore, in a plan view, the entire dummy pattern 430 may be covered with the light blocking layer 710.

Referring to FIG. 14, (2-1)th sub-openings SOP2a and (2-2)th sub-openings SOP2b are defined in a pixel defining layer 209. The (2-1)th sub-openings SOP2a may expose portions of a pixel electrode 210a of a (2-1)th organic light-emitting diode OLED2a. Similarly, the (2-2)th sub-opening SOP2*b* may expose portions of a pixel electrode 210*b* of a (2-2)th organic light-emitting diode OLED2*b*. The (2-1)th sub-openings SOP2*a* may define sub-emission areas SEA2*a* of the (2-1)th organic light-emitting diode OLED2*a*, and the (2-2)th sub-openings SOP2*b* may define sub-emission areas SEA2*b* of the (2-2)th organic light-emitting diode OLED2*b*.

A dummy pattern 430 may be disposed to overlap a portion 209P of the pixel defining layer 209 disposed between two adjacent (2-1)th sub-openings SOP2*a*.

A light blocking layer 710 may have (2-1)th sub-holes SH2*a* through which light emitted from the (2-1)th organic light-emitting diode OLED2*a* is transmitted, and (2-2)th sub-holes SH2*b* through which light emitted from the (2-2)th organic light-emitting diode OLED2*b* is transmitted. For example, the (2-1)th sub-holes SH2*a* may define (2-1)th sub-transmission areas SHA2*a*, and the (2-2)th sub-holes SH2*b* may define (2-2)th sub-transmission areas SHA2*b*. The (2-1)th sub-transmission area SHA2*a* may overlap the (2-1)th sub-emission area SEA2*a*, and the (2-2)th sub-transmission area SHA2*b* may overlap the (2-2)th sub-emission area SEA2*b*.

In an embodiment, in a plan view, the (2-1)th sub-opening SOP2*a* may be located in the (2-1)th sub-hole SH2*a*. For example, an edge of the (2-1)th sub-opening SOP2*a* may be spaced apart from the an edge of the (2-1)th sub-hole SH2*a* by a fourth distance d4. Similarly, the (2-2)th sub-opening SOP2*b* may be located in the (2-2)th sub-hole SH2*b*.

In an embodiment, a width w5 of the portion 209P of the pixel defining layer 209 between the (2-1)th sub-emission areas SEA2*a* adjacent to each other may be greater than a width w9 of a second partition PT2 between the (2-1)th sub-transmission areas SHA2*a*. Therefore, the (2-1)th sub-emission areas SEA2*a* may be exposed through the (2-1)th sub-holes SH2*a*. Similarly, the (2-2)th sub-emission areas SEA2*b* may be exposed through the (2-2)th sub-holes SH2*b*.

In an embodiment, a width w8 of the dummy pattern 430 overlapping the portion 209P of the pixel defining layer 209 disposed between the (2-1)th sub-emission areas SEA2*a* adjacent to each other may be less than the width w9 of the second partition PT2 between the (2-1)th sub-transmission areas SHA2*a*. Therefore, in a plan view, the entire dummy pattern 430 may be covered with the light blocking layer 710.

A fourth distance d4 from one edge of the (2-1)th sub-opening SOP2*a* to one edge of the (2-1)th sub-hole SH2*a* may be less than the third distance d3 illustrated in FIG. 13. Therefore, light traveling from the (2-1)th organic light-emitting diode OLED2*a* in a direction crossing the thickness direction (z-direction) perpendicular to the upper surface of the substrate 100 may be further removed than light traveling from the (1-1)th organic light-emitting diode OLED1*a* in a direction crossing the thickness (z-direction) perpendicular to the upper surface of the substrate 100. For example, the luminance when the viewing angle in the first area DA1 is 45 degrees or more may be 30% or more of the luminance when viewed from the front of the display panel 10, and the luminance when the viewing angle in the second area DA2 is 45 degrees or more may be 10% or less of the luminance when viewed from the front of the display panel 10. That is, the display panel 10 may provide a narrower viewing angle in the second area DA2 than in the first area DA1.

Figure 15:
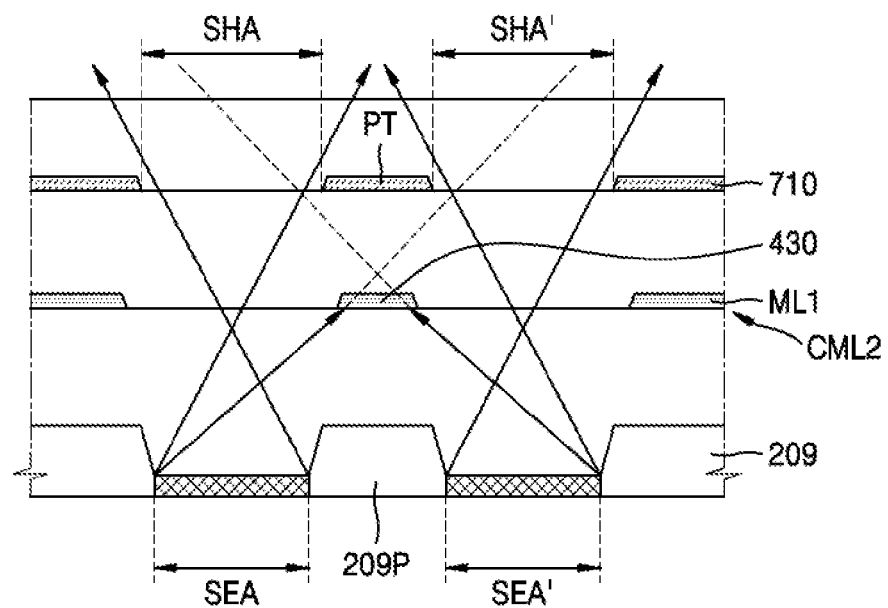
FIG. 15 is a diagram for describing a light blocking layer according to an embodiment.

FIG. 15 is a diagram for describing the function of the dummy pattern 430 according to an embodiment.

Referring to FIG. 15, the dummy pattern 430 may be disposed to overlap the portion 209P of the pixel defining layer 209 between sub-emission areas SEA and SEA' adjacent to each other. In an embodiment, the dummy pattern 430 may be included in the second conductive layer CML2 of the input sensing layer 400. In another embodiment, the dummy pattern 430 may be included in the first conductive layer (CML1 of FIG. 6) of the input sensing layer 400.

The dummy pattern 430 may include the same material as that of the first conductive line ML1. For example, the dummy pattern 430 may include molybdenum (Mo), mendelevium (Mb), silver (Ag), titanium (Ti), copper (Cu), aluminum (Al), and/or any alloy thereof.

The dummy pattern 430 may function as a light blocking layer. For example, when there is no dummy pattern 430, light emitted from one sub-emission area SEA may not be emitted to the overlapping sub-transmission area SHA, but may be emitted through the adjacent sub-transmission area SHA'. The dummy pattern 430 blocks the path of light emitted through the adjacent sub-transmission area SHA'. Therefore, when viewed from the side, the display apparatus may be designed to minimize or block the viewing angle.

Figure 16:
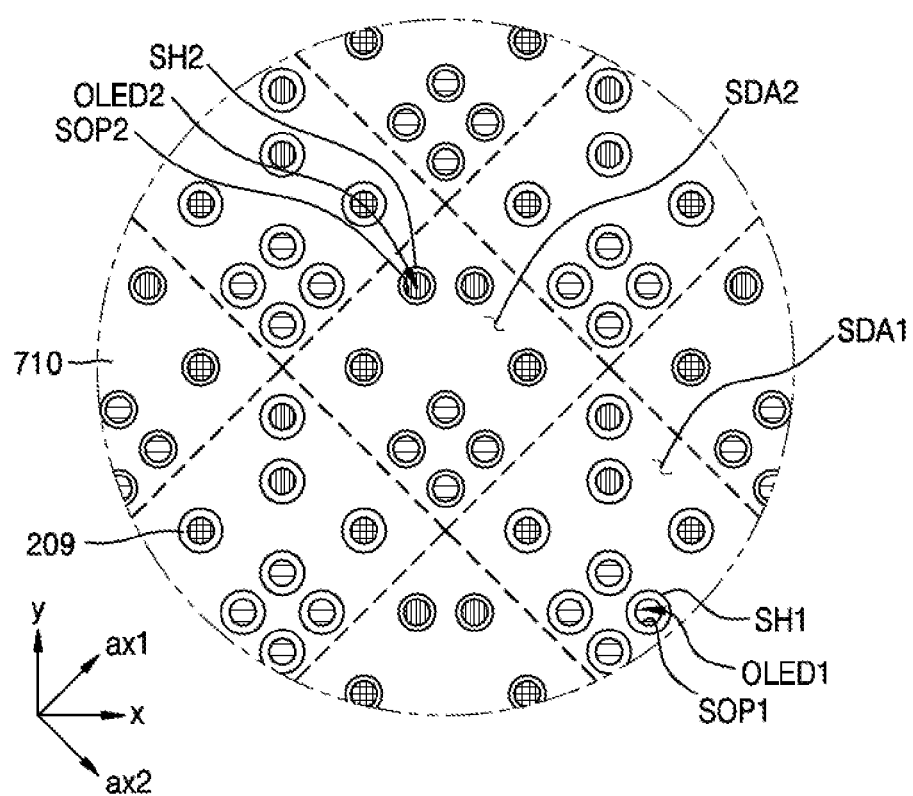
FIGS. 16 and 17 are plan views illustrating a portion of a display apparatus according to an embodiment.
Figure 17:
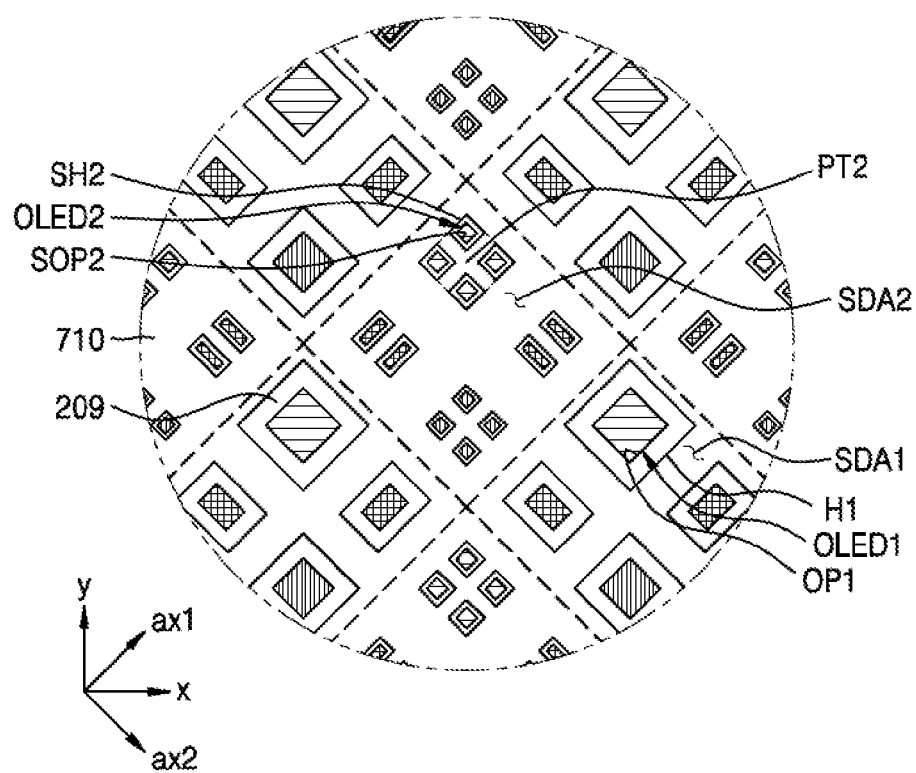

FIGS. 16 and 17 are plan views schematically illustrating a portion of a display apparatus, according to an embodiment. FIGS. 16 and 17 illustrate the planar shapes of pixels arranged in a first area SDA1 and a second area SDA2 according to embodiments.

Referring to FIG. 16, a pixel defining layer 209 may be arranged in the first area SDA1 and the second area SDA2. First sub-openings SOP1 exposing a portion of a pixel electrode of a first organic light-emitting diode OLED1 and second sub-openings SOP2 exposing a portion of a pixel electrode of a second organic light-emitting diode OLED2 are defined in the pixel defining layer 209.

In an embodiment, the first sub-openings SOP1 may expose a portion of the pixel electrode of the first organic light-emitting diode OLED1. In an embodiment, the first sub-opening SOP1 may divide one pixel electrode into one or more sub-emission areas. Similarly, the second sub-openings SOP2 may expose a portion of the pixel electrode of the second organic light-emitting diode OLED2. In an embodiment, the second sub-opening SOP2 may divide one pixel electrode into one or more sub-emission areas.

In a plan view, the first sub-opening SOP1 and the second sub-opening SOP2 may have a circular shape or an elliptical shape.

A light blocking layer 710 that at least partially absorbs external light or internally reflected light may be disposed on the pixel defining layer 209. A first sub-hole SH1 overlapping the first sub-opening SOP1 and a second sub-hole SH2 overlapping the second sub-opening SOP2 are defined in the light blocking layer 710. In a plan view, the first sub-hole SH1 may have a shape similar to that of the first sub-opening SOP1, and the second sub-hole SH2 may have a shape similar to that of the second sub-opening SOP2.

A distance from an edge of the first sub-opening SOP1 to an edge of the first sub-hole SH1 may be greater than a distance from an edge of the second sub-opening SOP2 to an edge of the second sub-hole SH2. Therefore, a viewing angle of the first organic light-emitting diode OLED1 may be greater than a viewing angle of the second organic light-emitting diode OLED2.

Although not illustrated in FIG. 16, the first conductive layer (CML1 of FIG. 6) or the second conductive layer (CML2 of FIG. 6) may include a dummy pattern (not illustrated) surrounding at least a portion of the second sub-openings SOP2. In an embodiment, the first conductive layer (CML1 of FIG. 6) or the second conductive layer (CML2 of FIG. 6) may further include a dummy pattern (not illustrated) surrounding at least a portion of the first sub-openings SOP1.

As illustrated in FIG. 16, because the first sub-opening SOP1, the second sub-opening SOP2, the first sub-hole SH1, and the second sub-hole SH2 have a circular shape, a color shift according to an azimuth angle may be reduced.

Referring to FIG. 17, a pixel defining layer 209 may be arranged in a first area SDA1 and a second area SDA2. The pixel defining layer 209 may have first openings OP1 exposing a portion of a pixel electrode of a first organic light-emitting diode OLED1, and second sub-openings SOP2 exposing a portion of a pixel electrode of a second organic light-emitting diode OLED2.

For example, the pixel electrode of the first organic light-emitting diode OLED1 arranged in the first area SDA1 may be exposed through one first opening OP1. On the other hand, the pixel electrode of the second organic light-emitting diode OLED2 arranged in the second area SDA2 may be divided into one or more sub-emission areas by the second sub-openings SOP2.

In a plan view, the first opening OP1 and the second sub-opening SOP2 may have a circular shape, an elliptical shape, or a polygonal shape. The polygon may include a square, a rectangle, and a rhombus, and may have a round corner shape. In this regard, FIG. 17 illustrates the first openings OP1 and the second sub-openings SOP2 each having a rectangular shape. In an embodiment, the first opening OP1 and the second sub-opening SOP2 may each have a rectangular shape with rounded corners. One of the first opening OP1 and the second sub-opening SOP2 may have a rectangular shape, and the other of the first opening OP1 and the second sub-opening SOP2 may have a rectangular shape with rounded corners.

A light blocking layer 710 that at least partially absorbs external light or internally reflected light may be disposed on the pixel defining layer 209. The light blocking layer 710 has a first hole H1 overlapping the first opening OP1 and a second sub-hole SH2 overlapping the second sub-opening SOP2. In a plan view, the first hole H1 may have a shape similar to that of the first opening OP1, and the second sub-hole SH2 may have a shape similar to that of the second sub-opening SOP2.

Although not illustrated in FIG. 17, the first conductive layer (see CML1 of FIG. 6) or the second conductive layer (see CML2 of FIG. 6) may include a dummy pattern (not illustrated) surrounding at least a portion of the second sub-openings SOP2.

A distance from an edge of the first opening OP1 to an edge of the first hole H1 may be greater than a distance from an edge of the second sub-opening SOP2 to an edge of the second sub-hole SH2. Therefore, a viewing angle of the first organic light-emitting diode OLED1 may be greater than a viewing angle of the second organic light-emitting diode OLED2. Because the opening area of the first organic light-emitting diode OLED1 increases, the lifespan of the display apparatus may be improved.

According to embodiments, because the display apparatus includes the light blocking layer and the anti-reflection layer including the color filter, the display apparatus may improve light extraction efficiency of light extracted to the front of the display apparatus and minimize or block visibility from the side. Therefore, it is possible to prevent information displayed on the display apparatus from being exposed to people around the user.

According to embodiments, the display apparatus capable of minimizing the risk of personal information exposure in public facilities and multi-use facilities may be provided. However, such an effect is an example.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a substrate including a first area and a second area adjacent to the first area;
    a first display element arranged on the first area;
    a second display element arranged on the second area, wherein the first display element and the second display element emit a same color light;
    a pixel defining layer disposed on the substrate and defining a first opening corresponding to an emission area of the first display element and a second opening corresponding to an emission area of the second display element;
    an input sensing layer disposed on the first display element and the second display element;
    an anti-reflection layer disposed on the input sensing layer, the anti-reflection layer including color filters overlapping the emission area of the first display element and the emission area of the second display element, respectively; and
    a light blocking layer disposed on the anti-reflection layer and defining a first hole overlapping the emission area of the first display element and a second hole overlapping the emission area of the second display element,
    wherein a distance from an edge of the first opening to an edge of the first hole along a first direction is greater than a distance from an edge of the second opening to an edge of the second hole along the first direction, with an area of the first hole being greater than an area of the second hole.

2. The display apparatus of claim 1, wherein, in a plan view, the first hole and the second hole each have a circular shape, an elliptical shape, a polygonal shape, or a polygonal shape with rounded corners.

3. The display apparatus of claim 1,
    wherein, in a plan view, the first opening is located in the first hole, and the second opening is located in the second hole.

4. The display apparatus of claim 1, wherein an area of the first opening is equal to or greater than an area of the second opening.

5. The display apparatus of claim 1, wherein the input sensing layer includes conductive mesh patterns having a plurality of mesh holes, and
    wherein, in a plan view, the first hole is located in one of the plurality of mesh holes, and the second hole is located in another one of the plurality of mesh.

6. The display apparatus of claim 5, wherein, in a plan view, the light blocking layer covers the conductive mesh patterns.

7. The display apparatus of claim 1, wherein the second display element is one of a plurality of second display elements, wherein emission areas of the plurality of second display elements comprise a first emission area and a second emission area emitting different colors of light, wherein the color filters comprise a first color filter overlapping the first emission area and a second color filter respectively overlapping the second emission area, and wherein, in a plan view, the first color filter and the second color filter overlap each other in a region overlapping a portion of the light blocking layer corresponding thereto disposed between the first emission area and the second emission area.

8. The display apparatus of claim 7, wherein the input sensing layer includes conductive mesh patterns having a plurality of mesh holes, and wherein the first color filter and the second color filter overlap each other on the conductive mesh patterns.

9. The display apparatus of claim 1, wherein the anti-reflection layer further includes at least one overcoat layer disposed between the color filters and the light blocking layer.

10. The display apparatus of claim 1, wherein the first area is one of a plurality of first areas, and the second area is one of a plurality of second areas, and wherein the plurality of first areas and the plurality of second areas are alternately arranged in a first direction.

11. The display apparatus of claim 10, further comprising a controller configured to:

control the first display elements and the second display elements to emit light in a first driving mode, and control the first display elements not to emit light and the second display elements to emit light in a second driving mode.

12. A display apparatus comprising:

a substrate including a first area and a second area adjacent to the first area;

a first display element including a first pixel electrode arranged on the first area;

a second display element including a second pixel electrode arranged on the second area, wherein the first display element and the second display element emit a same color light;

an input sensing layer disposed on the first display element and the second display element;

an anti-reflection layer disposed on the input sensing layer, the anti-reflection layer including color filters overlapping an emission area of the first display element and an emission area of the second display element respectively; and a light blocking layer disposed on the anti-reflection layer and having a first partition and a second partition;

wherein the first partition defines a plurality of first sub-holes overlapping the first pixel electrode and the second partition defines a plurality of second sub-holes overlapping the second pixel electrode, wherein an area of the first sub-hole is greater than an area of the second sub-hole.

13. The display apparatus of claim 12, wherein, in a plan view, the first sub-hole and the second sub-hole each have a circular shape, an elliptical shape, a polygonal shape, or a polygonal shape with rounded corners.

14. The display apparatus of claim 12, wherein the input sensing layer includes:

conductive mesh patterns having a plurality of mesh holes;

a first dummy pattern surrounding at least a portion of the first sub-hole; and a second dummy pattern surrounding at least a portion of the second sub-hole, and wherein, in a plan view, the first partition at least partially overlaps the first dummy pattern, and the second partition at least partially overlaps the second dummy pattern.

15. The display apparatus of claim 14, wherein the input sensing layer includes conductive mesh patterns having a plurality of mesh holes, and wherein, in a plan view, the plurality of first sub-holes are located in one of the plurality of mesh holes, and the plurality of second sub-holes are located in another of the plurality of mesh holes.

16. The display apparatus of claim 14, wherein a width of the first partition is greater than a width of the first dummy pattern, and wherein a width of the second partition is greater than a width of the second dummy pattern.

17. The display apparatus of claim 12, further comprising a pixel defining layer disposed on the substrate wherein, the pixel defining layer defines a plurality of first sub-openings corresponding to a plurality of first sub-emission areas of the first display element, and a plurality of second sub-openings corresponding to a plurality of second sub-emission areas of the second display element, and in a plan view, the first sub-opening is located in the first sub-hole, and the second sub-opening is located in the second sub-hole.

18. The display apparatus of claim 17, wherein a distance from an edge of the first sub-opening to an edge of the first sub-hole is greater than a distance from an edge of the second sub-opening to an edge of the second sub-hole.

19. The display apparatus of claim 17, wherein an area of the first sub-opening is equal to or greater than an area of the second sub-opening.

* * * * *